(12) United States Patent  
Norman

(10) Patent No.: US 8,259,520 B2  
(45) Date of Patent: Sep. 4, 2012

(54) COLUMNAR REPLACEMENT OF DEFECTIVE MEMORY CELLS

(75) Inventor: Robert Norman, Pendleton, OR (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 319 days.

(21) Appl. No.: 12/592,330

(22) Filed: Nov. 23, 2009

(65) Prior Publication Data

US 2010/0232240 A1   Sep. 16, 2010

Related U.S. Application Data

(60) Provisional application No. 61/210,070, filed on Mar. 13, 2009.

(51) Int. Cl.
  *G11C 7/00* (2006.01)
(52) U.S. Cl. .......................... 365/200; 365/148; 365/63
(58) Field of Classification Search .................. 365/200, 365/148, 63, 210.1, 201
  See application file for complete search history.

(56) References Cited

U.S. PATENT DOCUMENTS 7,924,639 B2 *  4/2011  Park et al. ..................... 365/200
8,031,544 B2 * 10/2011  Kim et al. ..................... 365/200

* cited by examiner

*Primary Examiner* — David Lam
(74) *Attorney, Agent, or Firm* — Stolowitz Ford Cowger LLP

(57) ABSTRACT

Circuits and methods to compensate for defective memory in BEOL third dimensional memory technology are described. An integrated circuit is configured to perform columnar replacement of defective BEOL multi-layered memory. For example, the integrated circuit can include a primary BEOL memory array having a plurality of BEOL memory cells being configured to change resistivity, a secondary BEOL memory array having another plurality of BEOL memory cells being configured to change resistivity, and a FEOL restoration module associated with the primary BEOL memory array and the secondary BEOL memory array, the FEOL restoration module being configured to locate a BEOL memory cell within the secondary BEOL memory array to replace a defective BEOL memory cell within the primary BEOL memory array. The FEOL portion can be fabricated on a substrate and the BEOL portion can be fabricated above and in contact with the FEOL portion to form the integrated circuit.

7 Claims, 16 Drawing Sheets

COLUMNAR REPLACEMENT OF DEFECTIVE MEMORY CELLS

FIELD OF THE INVENTION

The invention relates generally to memory and more specifically to methods and apparatus for replacing defective memory cells.

BACKGROUND OF THE INVENTION

Conventional semiconductor fabrication processes have reduced device geometries to facilitate the fabrication of relatively dense memory cells. Memories having higher densities, however, are vulnerable to increased defect rates (e.g., defects per unit area). T0 salvage memory that otherwise would be lost due to defects, memory designers usually include extra memory to replace defective memory.

A conventional approach to salvaging memory divides a memory array into multiple, equal-sized areas in which each plane in a grouping is a separate, isolated collection of memory cells. A FLASH memory array, for example, can be partitioned into four equal areas. By partitioning memory in this manner, a memory is less susceptible to fatal defects that otherwise render the entire memory (e.g., the aggregate of all groupings) inoperative. T0 illustrate, consider that a defect in an un-partitioned memory causes an entire area to fail. As such, the entire memory array is unusable. But if the memory is partitioned, the defect will at most affect only the grouping in which the defect(s) resides. This allows the memory to remain usable, albeit with less memory capacity. T0 recover lost memory, some memories traditionally include extra columns in each grouping to replace a limited number of columns having defects. These extra columns are typically selected by programming bits stored in non-volatile registers to indicate which one of a number of substitute columns will be used to replace a defective column. Therefore, each grouping is usually associated with a dedicated set of non-volatile registers. Further, each grouping usually includes an extra decoder to uniquely select each of the extra columns.

While this approach is functional, it has drawbacks. First, extra columns, non-volatile registers, and extra decoders, if used, collectively consume amounts of surface area in traditional memory architectures. This, in turn, increases the die size (e.g., in the X and Y dimensions of the die). Second, memory designers are typically faced with deciding how many extra memory columns to add to each grouping, especially since memory fabrication processes can randomly cause any number of unforeseen defects. If a memory designer adds too many extra columns, then any unused memory that does not remedy a defect will unnecessarily increase the die size. But if the memory designer adds too few extra columns, then the memory array cannot support its intended memory capacity, which decreases the yield of good memories. Third, conventional column replacement techniques, as described above, do not usually adapt to the different defects rates that each grouping might experience. For example, consider that each of eight groupings includes five extra columns to replace five defective columns, if necessary. Next, consider that a fabrication process introduces defects in each memory as follows: one of the eight groupings has six defective columns while the other groupings have two defective columns. As is common, the extra columns in the other groupings (e.g., the ones with two defective columns) cannot be used to replace the sixth defective column, and, thus, the sixth column renders its grouping inoperative. Fourth, accessing the extra columns using conventional column replacement techniques can ordinarily have longer access times than accessing a main array, especially if the detection of defects and implementation of the extra columns are performed, for example, serially.

There are continuing efforts to improve technology for salvaging memory that include defects.

BRIEF DESCRIPTION OF THE FIGURES

The invention and its various examples are more fully appreciated in connection with the following detailed description taken in conjunction with the accompanying drawings, in which.

Although the previous drawings depict various examples of the invention, the invention is not limited by the depicted examples. It is to be understood that, in the drawings, like reference numerals designate like structural elements. Also, it is understood that the depictions in the described drawings are not necessarily drawn to scale.

DETAILED DESCRIPTION

Figure 1:
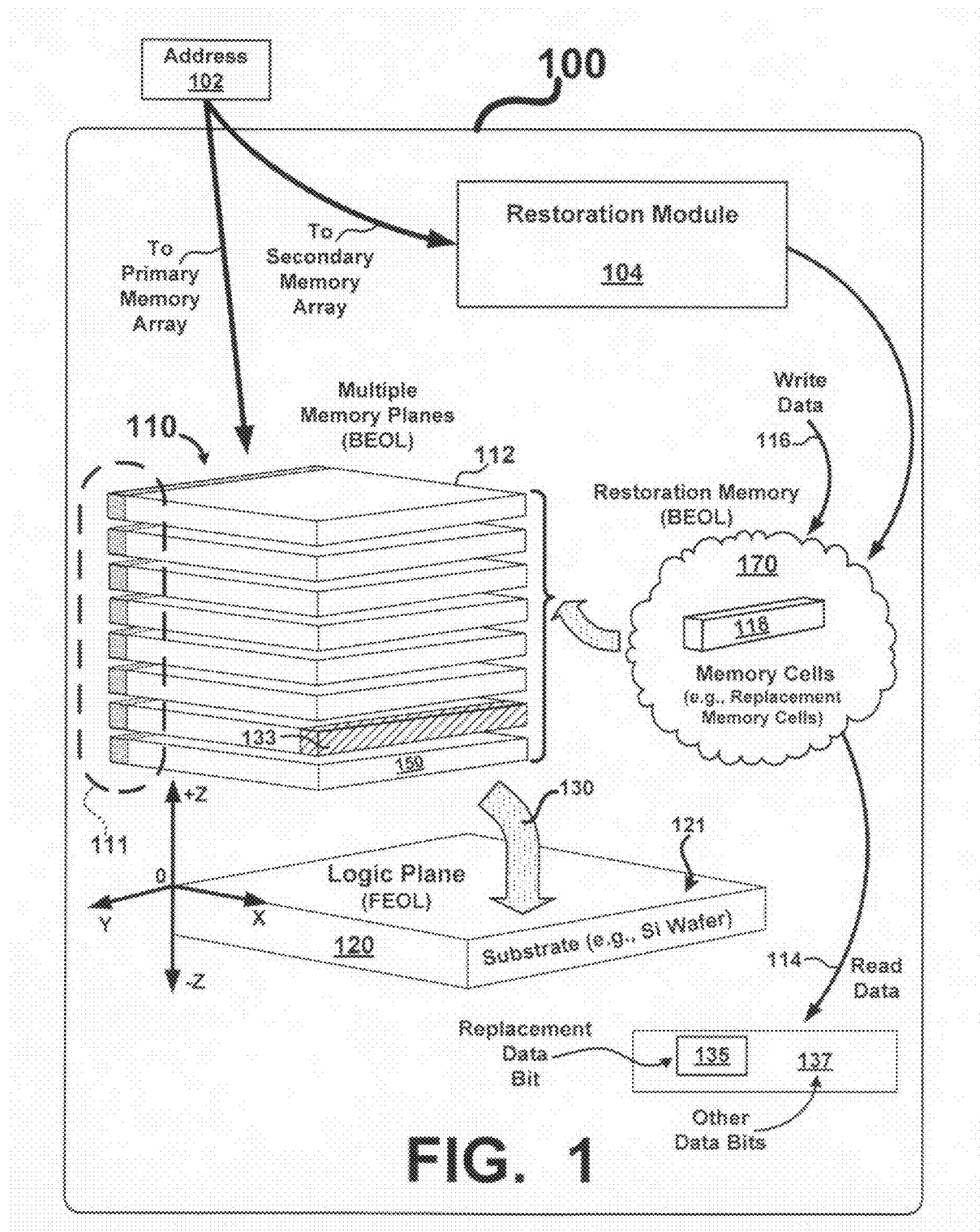
FIG. 1 depicts an apparatus implementing a restoration module configured to replace memory cells disposed in multiple planes of memory.

FIG. 1 depicts an apparatus 100 implementing a restoration module configured to replace memory cells disposed in multiple memory planes. Apparatus 100 includes a restoration module 104, a memory array 110 including multiple planes 112 of memory formed on top of each other (e.g., in the +Z dimension), restoration memory 170 and logic plane 120. Restoration memory 170 can be configured to restore memory found in memory array 110 that otherwise would be unavailable due to, for example, defects. As shown, memory array 110 can include a subset 118 of restoration memory 170, each including any number of memory cells that can constitute a substitute column (or portion thereof) for replacing defective memory cells found in memory array 110. In one example, at least one memory cell of subset 118 can reside in a different plane in memory array 110 than at least one defective memory cell associated with a defective column. For example, subset 118 can be implemented in one or more of columns 111, and columns 111 can constitute restoration memory 170 (or a portion thereof). To illustrate, consider that restoration memory 170 can be configured to replace a defective column 133 (or a portion thereof) as any of columns 111 (or a portion thereof). Note that while that one or more of columns 111 are shown to be distributed in each plane, this need not be the case in other examples (e.g., one or more columns 111 can be disposed in one plane, which is not shown). Therefore, restoration module 104 can be configured to substitute subset 118 of memory cells for one or more defective memory cells of one or more defective columns in memory array 110, whereby the one or more defective memory cells and the one or more replacement memory cells in subset 118 can be distributed anywhere throughout multiple planes 112 of memory. As used herein, a "plane" refers generally, to a flat, conceptual surface passing containing, for example, the X and Y axes, the Y and +Z axes, or the +Z and X axes, as well as any similar surface that is parallel to any of the aforementioned axes.

In view of the foregoing, apparatus 100 can include restoration memory 170 in memory array 110 without increasing the die size of, for example, logic plane 120 or the substrate (not shown), such as a silicon wafer for example, upon which logic plane 120 is formed. Specifically, adding restoration memory 170 in multiple planes 112 of memory affects the +Z dimension of apparatus 100 rather than the X and Y dimensions. As such, implementation of restoration memory 170 can facilitate defective column replacement without increasing the die size to include restoration memory 170 in logic plane 120.

Additionally, restoration module 104 can vary an amount of substitute columns, such as the amount of columns 111, which can be used as restoration memory 170 to restore memory in different regions having different numbers of defects per region. This can thereby obviate a restriction to using a substitute column for separate portions of memory array 110. This can improve the usage of memory cells to implement substitute columns that otherwise might be unused. As used herein, a "region" in memory refers generally, to a grouping of memory cells with which a rate of defects (e.g., a number of defects per unit region) can be determined, whereby the memory cells in the grouping can be arranged into columns (e.g., Y-lines). For example, a region can be any volume that includes memory cells in, for example, a portion of a plane in at least one of multiple planes 112 of memory. In at least some examples, a region can refer to a group of one or more planes, sub-planes, or like subdivisions of memory. In at least some embodiments, any of columns 111 can replace defective columns in any region of multiple planes 112 of memory.

Further, restoration module 104 can be configured to detect a defect within a defective column, such as column 133, and, in response, divert access to subset 118 of memory cells in, for example, in any of substitute columns 111 to, for example, obtain a replacement bit for a set of data bits (e.g., a byte) that can be read out of memory. Restoration module 104 can be configured to collaborate with third dimensional memories, which can have relatively small sizes and fast access times, to access replacement memory cells of subset 118 in parallel, or is substantially in parallel, to the access of column 133. As such, there can be substantially no or substantially negligible amounts of time to access either memory array 110 or restoration memory 170. Additionally, parallel access to restoration memory 170 can facilitate expeditious replacement of defective columns, which otherwise might not be the case. As used herein, the term "access" refers generally, to a data operation on a memory, such as a write operation (e.g., applying write data 116), a read operation (e.g., retrieving read data 114), or any other memory operation. In still other examples, restoration module 104 operates to detect at least address 102 (e.g., on an address bus) of an access to a defective columnar memory cell. In one example, one of columns 111 can provide a replacement data bit 135 for read data 114, while other data bits 137 can be provided by memory cells in columns in association with address 102. Although the foregoing description of FIG. 1 has been in reference to multiple planes 112 of memory in memory array 110, the apparatus 100 can be configured to implement a restoration module configured to replace memory cells disposed in single plane or layer of memory. Accordingly, the memory array 110 can comprise a single memory plane denoted as memory plane 150 and the restoration module 104 can be configured to implement defective memory cell replacement as described above on the single memory plane 150.

The memory array 110 whether implemented as multiple planes 112 of memory or as single memory plane 150 can include a memory array including non-volatile memory cells configured to store data. The memory array(s) can be used to implement the primary memory array, the secondary memory array, or both. Furthermore, the memory array(s) can be partitioned such that some portions of an array are used for data storage and other portions of the array are used for other purposes including but not limited to defective cell tables, registers, restoration memory, and secondary memory array. Those other functions can be implemented in a single memory plane or they can be implemented over arrays positioned in multiple memory layers. For example, given four vertically stacked planes of memory, a first memory plane can implement data storage and a secondary memory array, a second memory plane can implement data storage and restoration memory, a third memory plane can implement data storage only, and a fourth memory plane can implement data storage and a defective cell table.

Implementation of the memory array can be accomplished using a non-volatile two-terminal cross-point memory array. The memory array can be vertically stacked such that multiple layers or planes of memory can be configured by vertically stacking (e.g., in the +Z direction) a plurality of the two-terminal cross-point memory array on top of one another. U.S. patent application Ser. No. 11/095,026, filed Mar. 30, 2005, now U.S. Published Application No. 2006/0171200, and entitled "Memory Using Mixed Valence Conductive Oxides," and hereby incorporated by reference in its entirety for all purposes describes non-volatile third dimensional memory cells that may be arranged in a two-terminal, cross-point memory array that can be configured as a single layer of cross-point memory or as multiple vertically stacked layers of cross-point memory. New memory structures are possible with the capability of this third dimensional memory array. In at least some embodiments, a two-terminal memory cell or memory element can be configured to change conductivity when exposed to an appropriate voltage drop across the two-terminals. The memory cell can include an electrolytic tunnel barrier and a mixed valence conductive oxide. A voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen perovskites and lanthanum-nickel-oxygen perovskites) change valence, their conductivity changes. Additionally, oxygen accumulation in certain electrolytic tunnel barriers (e.g., yttrium stabilized zirconia) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A non-volatile memory can be designed to exploit tunnel barrier height modification, tunnel barrier width modification, or both. The technology allows for the emulation of other memory technologies by duplicating the interface signals and protocols, while accessing the third dimensional memory array. The third dimensional memory array may emulate other types of memory, providing different memory combinations (e.g., DRAM and FLASH) within a single component. To illustrate the functionality of a third dimensional memory cell, consider that the third dimensional memory cell switches to a low resistive state in response to a first write voltage, and switches to a high resistive state when a second write voltage is applied. In some examples, the first write voltage may be opposite in polarity from the second write voltage. The resistance of the memory cell may be adjusted by the voltage differential across the memory cell. As such, the two terminals of the memory cell may be coupled to one or more variable voltage sources to create a voltage differential across the two terminals. For example, a first terminal of the memory cell may be programmed to be a certain voltage between, for instance, +3 Volts and −3 Volts. Further, a second terminal of the memory cell may be programmed to be another voltage between, for instance, +3 Volts and −3 Volts.

In some examples, an electrolytic tunnel barrier and one or more mixed valence conductive oxide structures do not need to operate in a silicon substrate, and, therefore, can be fabricated (e.g., back-end-of-the-line BEOL) above circuitry being used for other purposes (e.g., circuitry fabricated front-end-of-the-line FEOL). Further, a two-terminal memory cell can be arranged as a cross point such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½−VW1 to the Y-direction line), the memory cell can switch to a low resistive state. When a second write voltage, VW2, is applied across the memory cell (e.g., by applying ½ VW2 to the X-direction line and ½−VW2 to the Y-direction line), the memory cell can switch to a high resistive state. Memory cells using electrolytic tunnel barriers and mixed valence conductive oxides can have VW1 opposite in polarity from VW2.

Accordingly, the memory cells based on non-volatile memory can be fabricated BEOL over circuitry that was previously fabricated FEOL on a substrate (e.g., a silicon—Si wafer). A FEOL inter-level interconnect structure can be used to electrically couple the BEOL memory cells with the FEOL fabricated circuitry in the substrate below. Furthermore, the memory cells can be fabricated along with a two-terminal cross-point memory array that is fabricated BEOL above the aforementioned FEOL circuitry positioned on the substrate below. The FEOL circuitry fabricated on the substrate below (e.g., CMOS circuitry) can include circuitry for performing data operations (e.g., read, write, program, and erase) on two-terminal memory cells positioned in the two-terminal cross-point memory array and operative to store data as a plurality of conductivity profiles. The same or different FEOL circuitry can be used to access the memory cells.

Referring back to FIG. 1, the multiple 112 or single 150 memory planes in memory array 110 can be fabricated BEOL (e.g., in the +Z direction) above the logic plane 120 which is fabricated FEOL (e.g., in the −Z direction). Here, a "0" on the X-Y-Z axes denotes a demarcation point between circuitry structures fabricated FEOL (e.g., −Z axis) and non-volatile memory structures fabricated BEOL (e.g., +Z axis). The logic plane 120 comprises a base layer upon which circuitry elements are fabricated FEOL as part of a microelectronics fabrication process (e.g., a CMOS process). The base layer can comprise a semiconductor substrate, such as a silicon wafer, for example. At least a portion of the circuitry fabricated on the substrate is electrically coupled with the memory array 110 using an interconnect structure fabricated FEOL (e.g., vias, thrus, and the like). First, the circuitry required for performing data operations on the memory array 110 is fabricated FEOL and then second, the memory array 110 is fabricated BEOL on top of the logic plane 120 (e.g., on top 130 of an uppermost surface 121 of logic plane 120). Here, the BEOL portion will be in contact with the uppermost surface 121 of logic plane 120 and the uppermost surface 121 can comprise a portion of the FEOL fabricated interconnect structure. In that the FEOL logic plane 120 is fabricated first and the BEOL memory array 110 is fabricated second, the FEOL portion need not be processed and/or fabricated at the same production facility as the BEOL portion. The logic plane 120 can include circuitry configured for functions other than data operations on the memory array 110. For example, the logic plane 120 can include circuitry for data operation on the memory array 100 as well as for replacement of defective memory cells and can also include circuitry for other functions such as a microprocessor (µP), a digital signal processor (DSP), analog circuitry, direct memory access (DMA) circuitry, audio circuitry, video circuitry, image capture and/or processing circuitry, just to name a few. The actual circuitry implemented in the logic plane 120 will be application dependent. Unless otherwise described herein, circuitry, elements, or structures that are not specifically denoted as FEOL can be fabricated FEOL. Therefore, as described herein (e.g., in the FIGS.) where BEOL elements are described, elements that are not described as being BEOL can be fabricated FEOL. Furthermore, a portion of the circuitry, elements, and structures described herein can be non-FEOL and configured to electrically couple with circuitry, elements, and structures that are FEOL. For example, a voltage generator configured to generate voltages for data operations on BEOL memory can be a separate IC that is electrically coupled (e.g., using PC board traces) to another IC that includes the FEOL circuitry and the BEOL memory fabricated above the FEOL circuitry.

Figure 2:
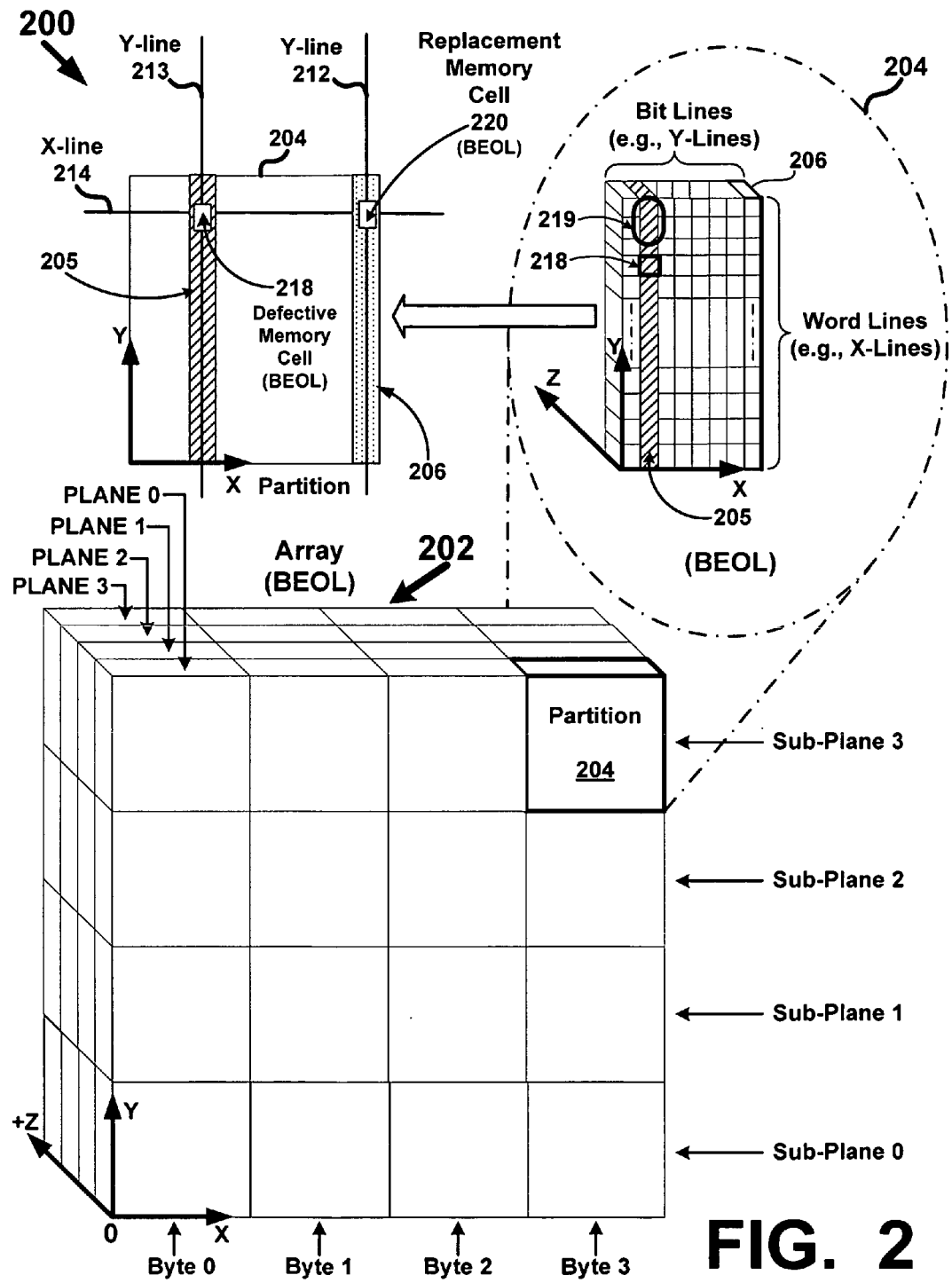
FIG. 2 depicts a perspective view of a portion of an array implementing partitions.

Attention is now directed to FIG. 2, where a perspective view of a portion of an array implementing partitions is depicted. Here, a BEOL third dimensional memory array 202 is composed of BEOL partitions, such as BEOL partition 204, which, in turn, can include a number of BEOL memory cells (not shown). Third dimensional memory array 202 can be implemented as memory array 110 of FIG. 1, with Plane 0 being disposed in contact with a logic plane (not shown). In some examples, third dimensional memory array 202 can include one or more memory planes, but is not limited to, a single memory plane. As shown, third dimensional memory array 202 can be described in three dimensions (e.g., with respect to X, Y, and Z axes). In various examples, third dimensional memory array ("array") 202 can be partitioned, as shown, to restore memory cells having defects in localized regions, such as column 205, using BEOL replacement memory positioned in array 202.

In some examples, array 202 can include multiple planes such as Plane 0, Plane 1, Plane 2 and Plane 3. In other examples, array 202 can also include subdivided planes ("SP") such as Sub-Plane 0, Sub-Plane 1, Sub-Plane 2, and Sub-Plane 3, all of which divide each BEOL plane into multiple BEOL sub-planes, which are portions of planes substantially parallel to the X-axis and Z-axis. In still other examples, array 202 can also include bytes such as Byte 0, Byte 1, Byte 2, and Byte 3, that can be arranged substantially parallel to the Y-axis and Z-axis can cause the aspect ratio of array 202 to improve (e.g., by maintaining the length in the Y direction to be substantially near to or the same as the width in the X direction). Array 202 can include more or less byte sections, and is not limited to four byte sections (e.g., Byte 0 to 3) as depicted. As depicted, partition 204 can represent a portion of array 202, being composed of, for example, memory cells at the intersection of a sub-plane and a byte section. At least in some examples, partition 204 can be determined in terms of planes, sub-planes, bytes, or any other division of memory.

To illustrate the implementation of partition 204 in accordance with at least some examples, consider that a grouping of cells, such as column 205, contains a defect. Partition 204 is shown to include memory cells in a portion of one plane in the Z dimension (e.g., Plane 0) in which memory cells (not shown) are located at intersections of Y-lines (e.g., bit lines) and X-Lines (e.g., word lines). In this example, partition 204 includes a substitute column 206, a column 205 (e.g., a column with at least one defect), and other columns (e.g., columns without defects). Substitute column 206 can be used to replace column 205 to provide, for example, a replacement memory cell 220 to replace a defective memory cell 218 in association with X-line 214. In at least some examples, replacement memory cell 220 can replace defective memory cell 218 independent of replacing column 205. Here, substitute column 206 and column 205 can be associated with Y-Lines 212 and 213, respectively. To identify column 205 as having a defect (e.g., defective cell 218), an address (e.g., address 102 of FIG. 1) can be detected as being related to the defect and then can be translated to provide a decoded address to select data stored in association with substitute column 206. Note that in some examples, column 205 can include another grouping of cells 219 (e.g., without a defect) in the Y direction that can be replaced along with other cells in column 206 (e.g., during an entire column substitution).

Figure 3:
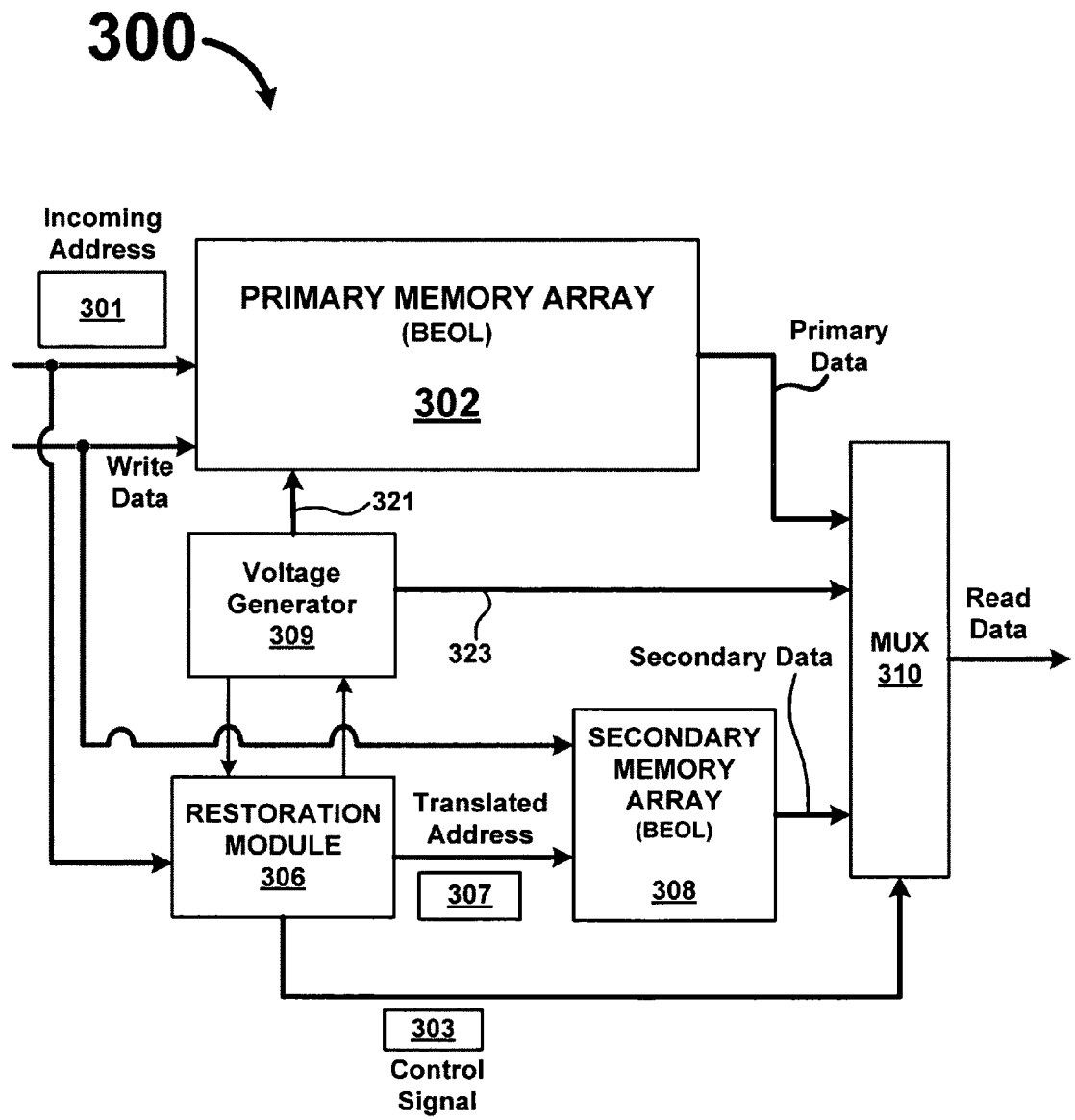
FIG. 3 is a block diagram depicting an example of an implementation of a restoration module.

FIG. 3 is a block diagram depicting an example of an implementation of a restoration module. Here, apparatus 300 shows a primary memory array 302, a restoration module 306, a secondary memory array 308, and a multiplexer ("MUX") 310. In some examples, primary memory array 302 can be the aforementioned third dimensional memory that can include a single plane of memory 150 or stacked planes of memory 110. Access to a defective column can be detected when an incoming address 301 is matched against a stored address (not shown) associated with a defective cell within primary memory array 302. The stored address can be stored in a register, latch, or a memory partition in one of the BEOL memory planes. To restore the defective cell, restoration module 306 can be implemented to replace a column containing the defective cell with a substitute column having another memory cell in secondary memory array 308. As shown, restoration module 306 can provide a control signal 303 to modify a datapath from the column in primary memory array 302 having the defective cell to a column in secondary memory array 308. In some examples, MUX 310 can be implemented to switch between an output of primary memory array 302 and secondary memory array 308 according to the control signal 303 provided by, for example, restoration module 306.

In some examples, restoration module 306 can use incoming address 301 to provide a translated address 307 by decomposing the incoming address 301 using restoration module 306. In other some examples, decomposing the incoming address 301 can include producing a representation for a plane, a sub-plane, and a byte, any of which can be associated with the location of the defective cell and can be represented by, for example, a binary number. In other examples, translated address 307 can be configured to access secondary memory array 308 (e.g., as part of a write or read operation). Thus, secondary memory array 308 can be configured to replace one or more defective cells. In some cases, the replacement of one or more defective cells can also include the replacement of other cells (e.g., non-defective cells) that are included in an associated column (or one or more portions thereof) in primary memory array 302.

In still other examples, restoration module 306 can be configured to control whether to apply voltages (321, 323) to either primary memory array 302 (e.g., voltage 321) or secondary memory array 308 (e.g., voltage 323) as function of whether incoming address 301 relates to a defective column. For example, restoration module 306 can cause a voltage generator 309 to suppress application of access voltages 321 (e.g., write and/or read voltages) to primary memory array 302 if incoming address 301 relates to a defective column. In another example, the application of voltages 323 from voltage generator 309 to secondary memory array 308 can be suppressed if incoming address 301 relates to non-defective columns. Voltage generator 309 can be configured to provide voltage for data operations on the primary and secondary arrays (302, 308), such as read voltages and write voltages. Typically a magnitude of the read voltage is less than a magnitude of the write voltage in order to prevent the data stored in a memory cell from being overwritten during a read operation. For example, the magnitude of a read voltage applied across the terminals of a memory cell can be 2V and the magnitude of a write voltage applied across the terminals of a memory cell can be 4V. The read and write voltages can be uni-polar or bi-polar and can be applied as a voltage pulse. In some examples, apparatus 300 and any of the above-described elements (e.g., any element shown and indicated by a reference numeral above) can be implemented differently in design, operation, and configuration, and are not limited to the descriptions provided herein. It should be noted that the gating of power is done on a bit bases for each operation, allowing normal access on good columns and blocked access on bad columns.

Figure 4A:
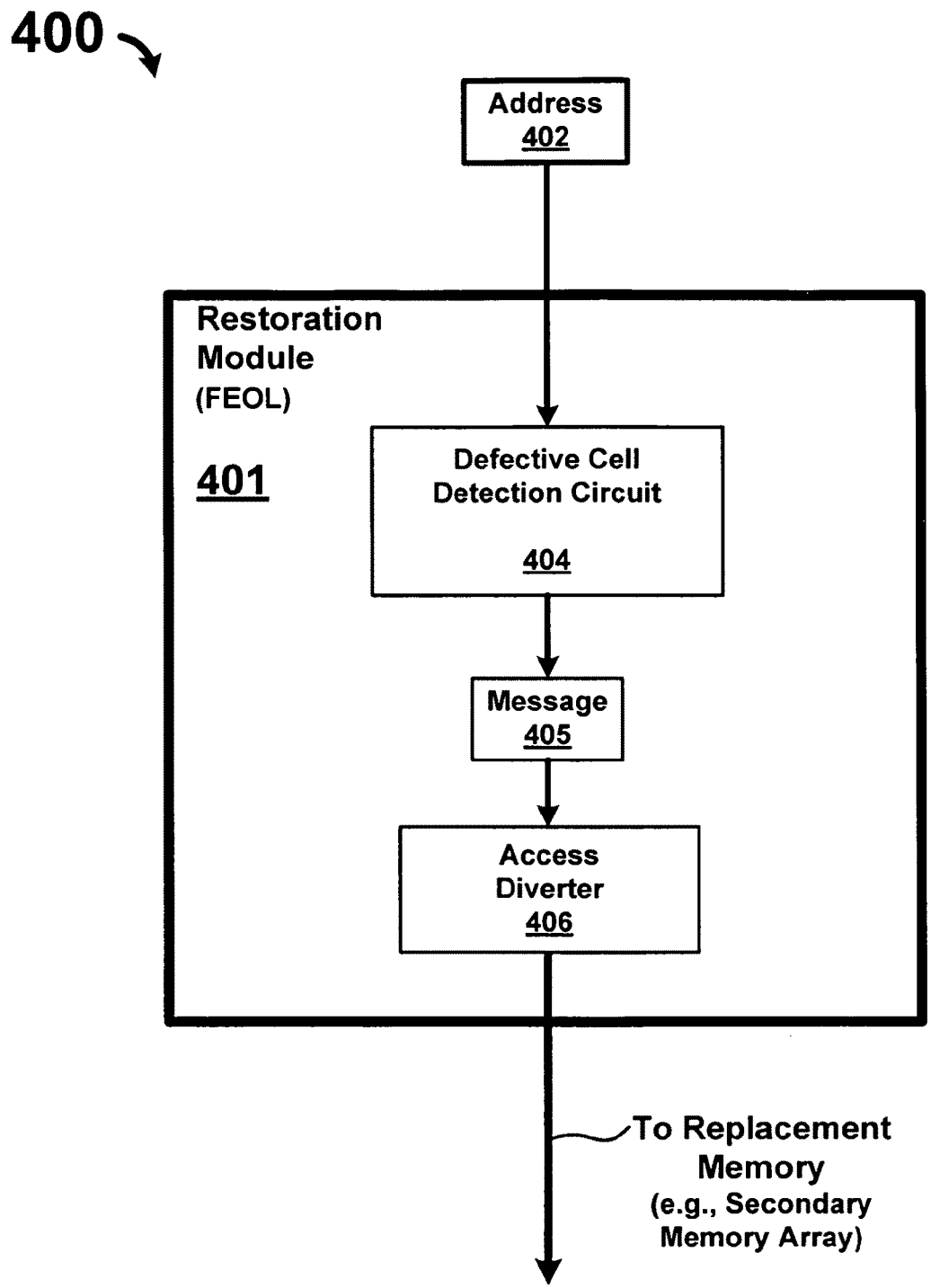
FIG. 4A is a block diagram depicting an example of a restoration module.

FIG. 4 is a block diagram 400 depicting an example of a restoration module. In this example, restoration module 401 can include a defective cell detection circuit 404 and access diverter 406. Defective cell detection circuit 404 can be configured to detect address 402 for accessing a memory location having a defect in at least one column. Upon detecting address 402 for a defective memory location, defective cell detection circuit 404 can generate a message 405 (e.g., a signal) specifying that address 402 is associated with a defective column. In response, access diverter 406 can be configured to identify a replacement column or memory location for the defective column or memory location. In some implementations, access diverter 406 can be configured to divert access from the primary memory array to a secondary memory array, such as replacement memory 170 (FIG. 1). Specifically, access diverter 406 can be configured to divert write operations (e.g., to write data) to replacement memory 170 (FIG. 1) and to divert read operations (e.g., to read data) from the replacement memory. In at least some examples, restoration module 401 can be configured to translate address 402 into a replacement memory address identifying substitute memory cells or a substitute column. In still other examples, the replacement memory address can be a translated address, such as translated address 307 of FIG. 3, which specifies for one or more of a plane, a subdivided plane, a byte, and a column.

Figure 4B:
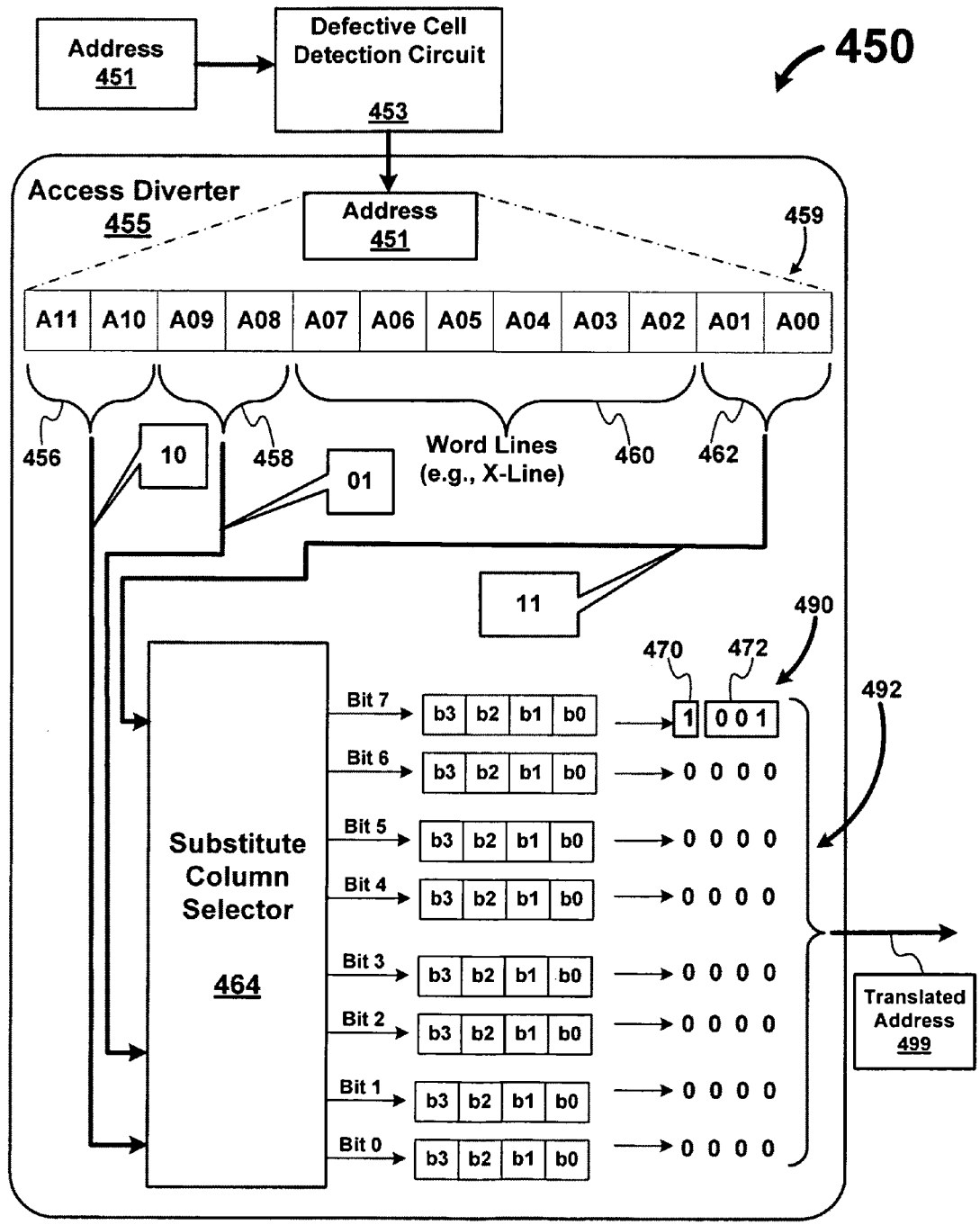
FIG. 4B depicts an example of an address decoding scheme to identify a substitute column (or a portion thereof) to replace a defective column (or a portion thereof.

FIG. 4B depicts an example of an address decoding scheme 450 operative to identify a substitute column (or a portion thereof) to replace a defective column (or a portion thereof). As depicted in scheme 450, defective cell detection circuit 453 can be configured to receive an address 451 and detect that address 451 is associated with a defective column. Defective cell detection circuit 453 can also be configured to relay address 451 to access diverter 455, which, in response, can generate a translated address 499.

In the example shown, access diverter 455 can use one or more of address bits ("A00 to A11") 459 to determine translated address 499. For instance, access diverter 455 can analyze address bits 459 to determine bits 456 (e.g., bits A11 and A10), that represent a plane, bits 458 (e.g., bits A09 and A08) that represent a sub-plane, bits 460 (e.g., bits A07 to A02) that represent word lines (e.g., sixty-four X-lines), and bits 462 (e.g., bits A01 and A00) that represent a byte. Substitute column selector 464 can be configured to determine translated address 499 as a function of, for example, bits 456, bits 458, and bits 462. In particular, substitute column selector 464 can use bits 456, bits 458, and bits 462 to provide at least one of a number of bits (e.g., bits 0 to 7) from a secondary memory array (not shown) as a substitute bit (or column), for example.

To illustrate operation of substitute column selector 464, consider that a defect was detected in a column associated with PLANE 2 (e.g., bits 456 are "10"), Sub-Plane 1 (e.g., bits 458 are "01"), and Byte 3 (e.g., bits 462 are "11") in a memory array, such as array 202 of FIG. 2, then the binary representation of address 451 can be "100100000011." In response to the values of bits 456, bits 458, and bits 462, substitute column selector 464 generates translated address 499, which can be composed of bits 490 (e.g., four bits) or bits 492 (e.g., thirty-two bits). If bits 490 constitute translated address 499, then an indication (not shown) of which bit is defective can be used. If bits 492 constitute translated address 499, then the indication of which bit is defective can be determined by the position of bits 490 (e.g., the eighth position as Bit 7) out of eight groups of four bits. Further to the example in which a defective column is associated with the $2^{nd}$ plane PLANE 2, the $1^{st}$ Sub-Plane 1, and the $3^{rd}$ byte Byte 3, consider that Bit 7 (and the corresponding column) is defective. For a defective Bit 7, substitute column selector 464 generates an error flag, such as setting bit 470 to "1," and an index, such as bits 472, which is an index into one of a number of substitute columns. Here, bits 472 are "001," and thus is an index into the $1^{st}$ column of 16 substitute columns, which are spare columns. In at least some examples, the data stored in the secondary memory array is identified by the index, which can be incremented by one for each defective column associated with, for example, the partition defined by bits 456 and bits 458, As such, defective columns in the primary memory will be associated with an index into the secondary memory array.

Note that while the examples above suggest that bits 456 support up to 4 planes, bits 458 support up to 4 sub-planes, and bits 462 support up to 4 bytes (e.g., to improve the aspect ratio in terms of the X and Y dimensions), bits 459 can include any number of bits. As such, bits 456, bits 458, and bits 462 can include any number of bits. Substitute column selector 464 can be disposed either internal to access diverter 455, or external thereto, or both. In some examples, there can be more or less binary bits representing each partition, such as partition 204 (FIG. 2). In some examples, the above-described elements (e.g., all elements shown and indicated by reference numerals above in FIG. 4B) can be implemented differently in design, operation, configuration, representation, and are not limited to the descriptions provided herein.

Figure 5:
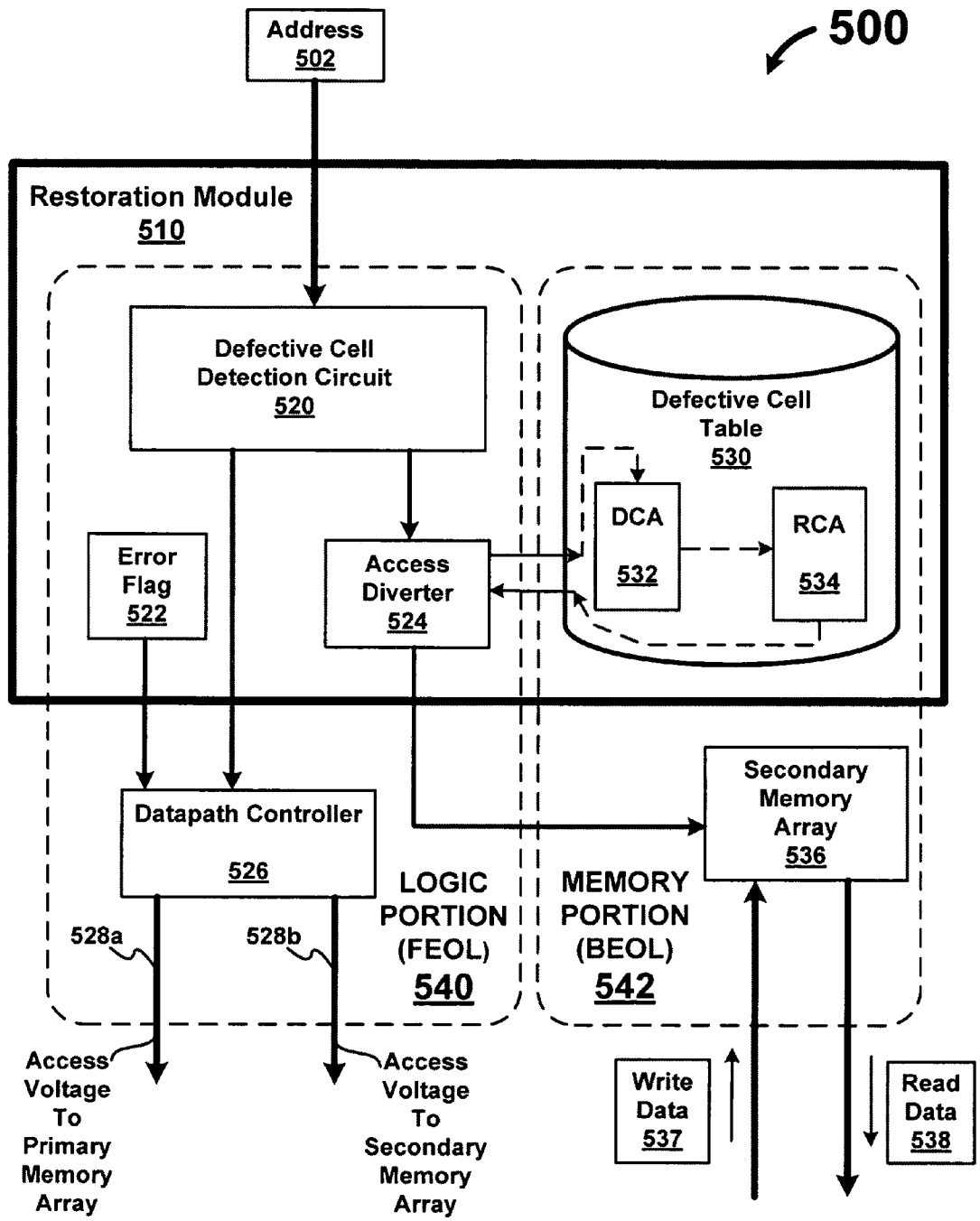
FIG. 5 is a block diagram depicting another example of a restoration module.

FIG. 5 is a block diagram depicting another example of a restoration module. Here, apparatus 500 includes a restoration module 510, a defective cell detection circuit 520, an access diverter 524, a datapath controller 526, and a secondary memory array 536. In at least some examples, defective cell detection circuit 520 can be configured to detect an address 502 for accessing a memory location having a defect. In other examples, detect address 520 can be configured to perform a comparison between address 502 and a defective cell address ("DCA") 532 that can be stored in defective cell table 530 to determine a match.

Upon matching address 502, access diverter 524 can be configured to use address 502 (or defective cell address 532) to identify a replacement cell address ("RCA") 534. In some examples, access diverter 524 can include logic to determine replacement cell address ("RCA") 534 in defective cell table 530, which can serve as a look-up table in various examples. In still other examples, restoration module 510 translates address 502 into replacement cell address 534 to identify substitute memory cells in secondary memory array 536. In particular, access diverter 524 can be configured to use secondary memory array 536 to divert the access (e.g., a write operation or a read operation) from the defective memory location in primary memory array (e.g., memory array 110 of FIG. 1) to the replacement memory location in replacement memory (e.g., replacement memory 170 of FIG. 1). Specifically, access diverter 524 can operate to divert write data 537 to, and read data 538 from, secondary memory array 536.

In some examples, restoration module 510 can include a logic portion 540 and a memory portion 542. Logic portion 540 can be formed FEOL in a logic plane (e.g., logic plane 120 of FIG. 1) and memory portion 542 can be formed BEOL in one or more planes in a third dimensional memory (e.g., single plane 150 or multiple planes 112 of memory of FIG. 1). In particular, logic portion 540 can include at least a portion of defective cell detection circuit 520 and at least a portion of access diverter 524, and memory portion 542 can include storage for defective cell table 530 in secondary memory array 536. Portion 540 can be formed using a CMOS fabrication process; whereas, portion 542 can be formed using a process for BEOL memory fabrication. In some examples, a portion of defective cell detection circuit 520 can include a part of defective cell table 530 (e.g., to determine defective cell address 532), and a portion of access diverter 524 can include another part of defective cell table 530 (e.g., replacement cell address 534).

Further to the example shown, defective cell detection circuit 520 can be configured to generate an error flag 522 configured to suppress, for example, access to a defective memory cell or a defective column. As such, defective cell detection circuit 520 can be configured to suppress the access to the defective memory cell or column in the primary memory array simultaneously, or substantially simultaneously, to access diverter 524 diverting the access to secondary memory array 536. In other examples, an integrated circuit including restoration module 510 can also contain datapath controller 526. Responsive to error flag 522, datapath controller 526 can be configured to suppress application of a primary access voltage on voltage line 528a to the primary memory array (not shown). In still other examples, datapath controller 526 can be configured to suppress application of a secondary access voltage on voltage line 528b to secondary memory array 536. Both primary and secondary access voltages on respective voltage lines 528a and 528b can include write voltages or read voltages. Note that secondary memory array 536 can reside in restoration module 510 in some implementations.

Figure 6:
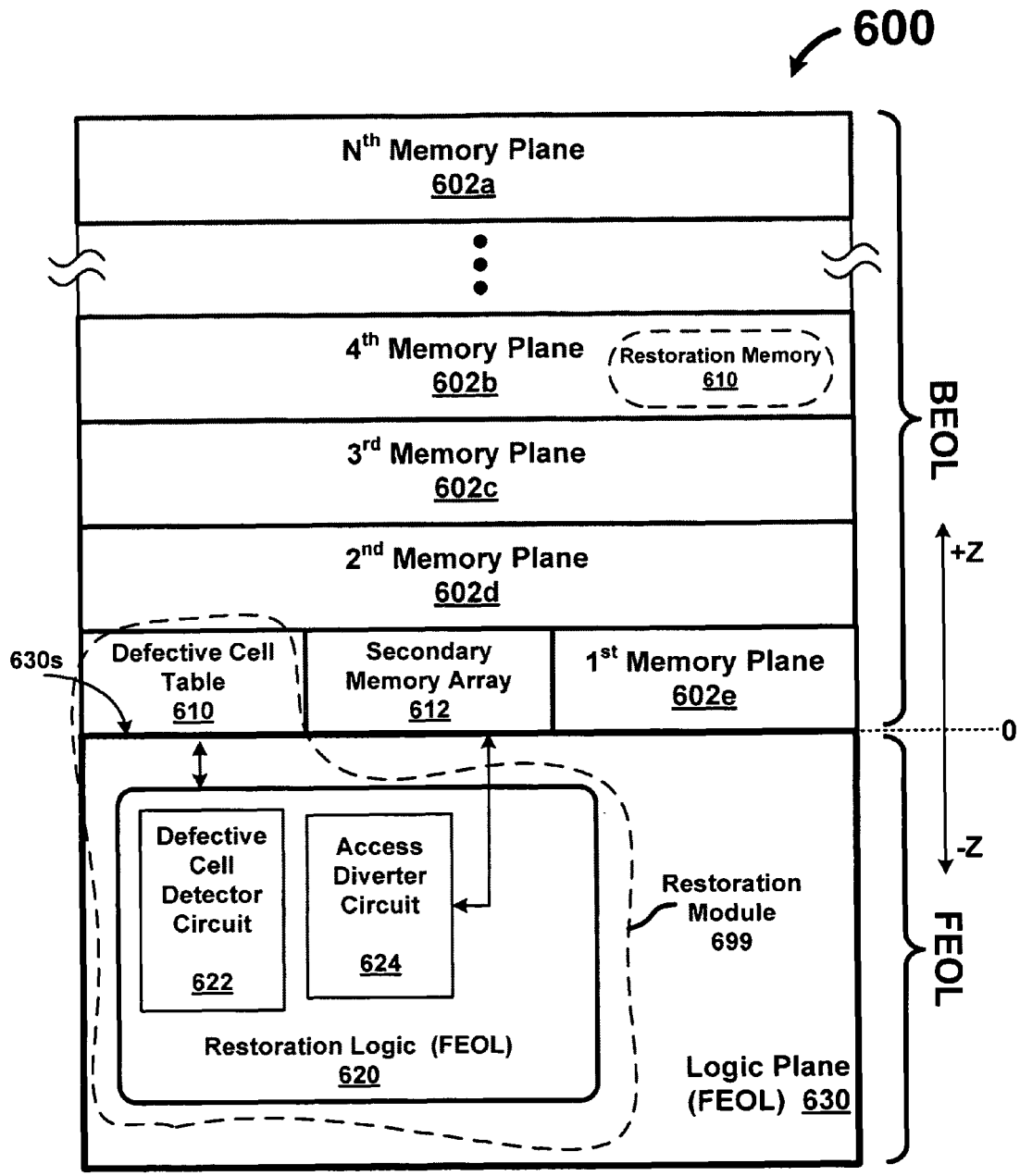
FIG. 6 depicts a cross-section view of an exemplary integrated circuit implementing a restoration module.

FIG. 6 depicts a cross-section view of an exemplary integrated circuit implementing a restoration module. Here, integrated circuit 600 includes memory planes 602a-602e, restoration module 699, secondary memory array 612, and logic plane 630. Integrated circuit 600 includes multiple memory planes being vertically disposed above or on logic plane 630 (e.g., in contact with the logic plane 630 and positioned +Z above the 0 origin of the X-Y-Z axes). The logic plane 630 can include logic circuitry for implementing defective memory replacement, and a semiconductor substrate (e.g., a silicon wafer) upon which the logic circuitry can be formed (e.g., using microelectronics fabrication processes). As shown in this example, restoration module 699 can be configured to include defective cell table memory 610 and restoration logic 620, which, in turn, can include can a defective cell detection circuit 622 and an access diverter circuit 624. Defective cell table memory 610 can be configured to store, for example, identifiers (e.g., addresses) that indicate that one or more cells in a column is defective for a specific identifier (e.g., address). As such, defective cell table memory 610 can store addresses that identify defective columns for replacement.

Multiple memory planes can include first memory plane 602e having defective cell table memory 610 and secondary memory array 612, both of which can be composed of third dimensional memory cells. Note that defective cell table memory 610 and secondary memory array 612 can be placed in other memory planes or sub-planes, and therefore, need not be restricted to first memory plane 602e. First memory plane 602e is also shown to contain a portion of a primary memory array (e.g., "1st memory plane"), which continues into second memory plane 602d of third dimensional memory cells. Third memory plane 602c, fourth memory plane 602b, and Nth memory plane 602a include third dimensional memory cells for a second array, a third array, and an Nth array, respectively. In other examples, the multiple memory planes depicted in integrated circuit 600 can include more or fewer planes than as shown in FIG. 6, any of which can emulate other types of memory technologies (e.g., DRAM, SRAM, and FLASH). Logic plane 630 can include circuitry operative to emulate the other memory technologies. Such that a host system (not shown) in communication with the IC 600 can perform data operations on those other memory types by communicating signals configured to conform with protocols for data operations on those other memory types.

The IC 600 can be a die singulated (e.g., sawed or cut) from a semiconductor wafer (e.g., a silicon Si wafer) that comprises a unitary whole, that is, the FEOL portion (i.e., along the −Z axis) comprising the logic plane 630 is fabricated first on the substrate and includes the active circuitry for performing data operations on the BEOL memory planes (i.e., along the +Z axis) that are fabricated second and directly on top of the FEOL portion on top of surface 630s (i.e., above the 0 point on the Z-axis along the +Z direction). As a result, the IC 600 comprises a single die that includes the FEOL and BEOL portions that are integrally connected to each other without using soldering, solder balls, substrate bonding, or the like to couple them. Essentially, the BEOL portion is grown directly on top of the FEOL portion using processing techniques that are well understood in the microelectronics art, such as lithography, plasma and chemical etching, chemical mechanical planarization, dielectric film and thin film depositions including but not limited to chemical vapor deposition (CVD), atomic layer deposition (ALD), sputtering, co-sputtering, physical vapor deposition (PVD), just to name a few. After the die for the IC 600 is singulated from its wafer, it can subsequently be inserted into a suitable package (not shown) for an IC. The concept of a single unitary die that includes a FEOL portion and a BEOL portion and packaging of the die will be described in greater detail below in regards to FIG. 11C.

Figure 7:
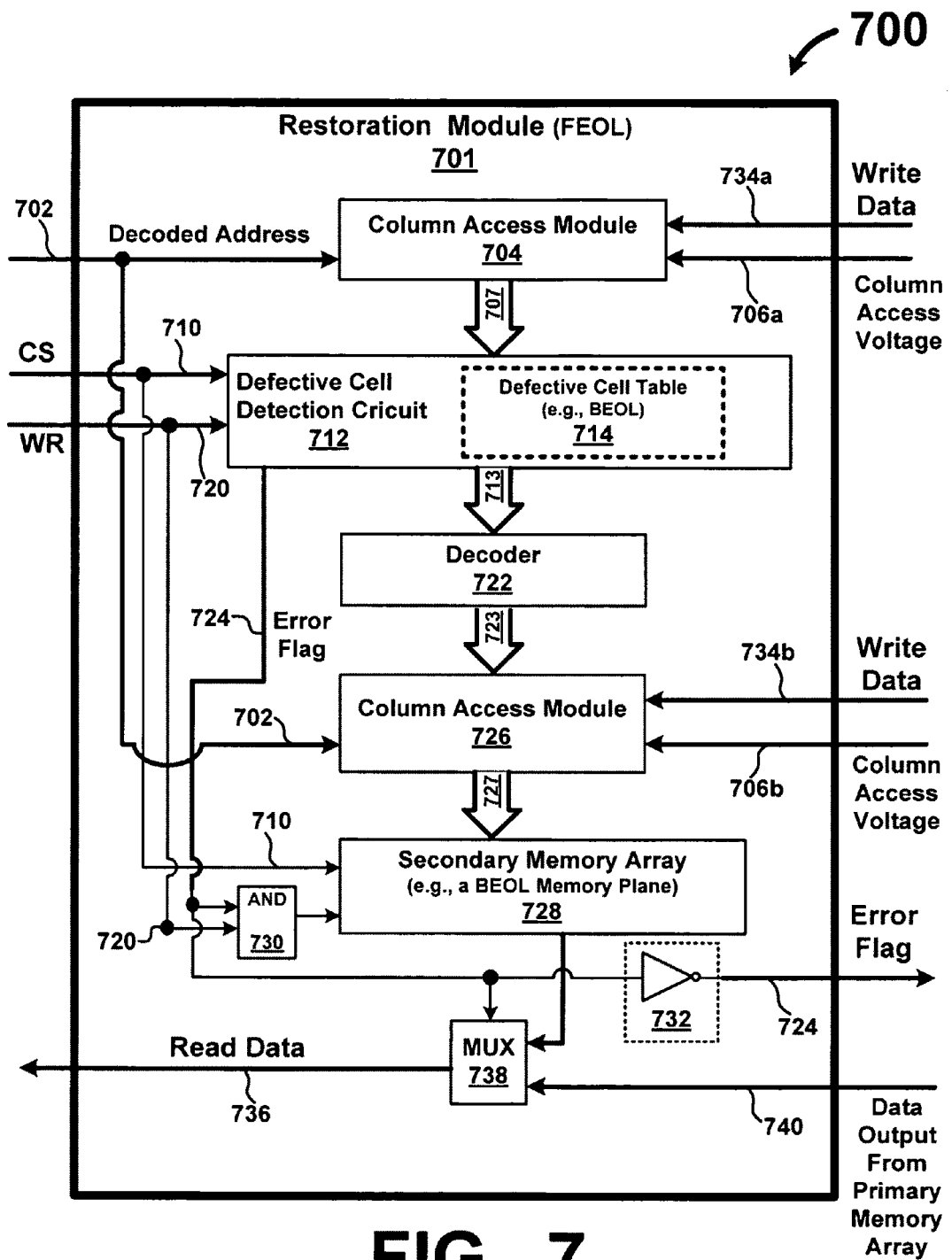
FIG. 7 depicts a detailed illustration of an exemplary restoration module.

FIG. 7 depicts a detailed illustration of an exemplary restoration module. Here, apparatus 700 includes a restoration module 701, a column access module 704, a defective cell detection circuit 712, a defective cell table ("Table") 714, a decoder 722, a column access module 726, a secondary memory array 728, a logic gate 730, an inverter 732, and a multiplexer 738.

Restoration module 701 can be configured to operate in at least two modes of operation. In one mode (e.g., a programming mode), restoration module 701 can use column access module 704 and defective cell detection circuit 712 to program defective cell table 714. In another mode (e.g., a operational/run mode), restoration module 701 can use defective cell detection circuit 712, defective cell table 714, decoder 722, column address module 726, and secondary memory array 728 to detect accesses to defective columns and to provide for replacement memory. The defective cell table 714 and/or the secondary memory array 728 can be positioned in a BEOL memory plane as described above. In some examples, defective cell table 714 can be programmed in programming mode during manufacturing (e.g., as part of the BEOL process) to store a list of defective cell addresses (e.g., in table 714) for detection and substitution.

In programming mode, chip select signal ("CS") on a chip select path 710 and write/read enable signal ("WR") on a write/read enable path 720 can be applied to restoration module 701 to program a portion of a third dimensional memory array that constitutes table 714. Decoded address 702 can be fed into restoration module 701 to select a memory cell into which data, such as write data 734a, is to be written. Then, the memory cell can be programmed. In at least some examples, write data 734a represents a defective cell address, and a mapping to a replacement memory address. In one example, column access module 704 can logically AND column access voltage 706a with decoded address on decoded address path 702 to determine which column lines (e.g., Y-lines) will be driven with write data 734a. Note that AND gate 730 prevents programming of secondary memory array 728 during programming. The functionality of AND gate 730 is discussed below. In some examples, the addresses in table 714 can be set to be above the memory address range of the primary memory array to avoid access to the primary array during programming of table 714. In various examples, the magnitudes of the access voltages for the columns can be set to values that are appropriate for third dimensional memory cells (e.g., read and write voltages having appropriate magnitude and polarity for data operations on BEOL memory cells).

In operational mode, secondary memory array 728 can be accessed during write and read operations targeting defective memory. To illustrate, consider the effects of write operations and read operations in connection with non-defective memory in the primary memory array. During write operations to non-defective memory, defective cell detection circuit 712 generates an error flag on error flag path 724 having logic level "0" (a "low state") during a write operation to non-defective memory. It is the low state of an error flag on error flag path 724 in this example that disables write/read enable signal on write/read enable signal path 720 at AND gate 730. The inactive state (e.g., low state) of an error flag on error flag path 724 suspends writes to secondary memory array 728. For read operations to non-defective memory, a low state of an error flag on error flag path 724 directs multiplexer ("MUX") 738 to route array output data on output data path 740 (e.g., from the primary memory array) as read data on read data path 736.

Now consider write operations and read operations with defective memory in the primary memory array during operational mode. In both cases, defective cell detection circuit 712 generates error flag 724 (e.g., logic level "1") upon detection of an access to defective memory. For write operations, defective cell detection circuit 712 can generate an error flag on error flag path 724 (e.g., it is in a high state) during write operations, which is logically AND'ed with write/read enable signal 720. The output of AND gate 730 enables writes to secondary memory array 728 as substitute memory. For read operations, an error flag on error flag path 724 in a high state directs multiplexer 738 to block array output data on output data path 740 and forwards the output data from secondary memory array 728 as read data on read data path 736.

When access to a defective cell address is detected, restoration module 701 transmits error flag 724 to suppress a write operation and/or a read operation in relation to the primary memory array and portions thereof. For example, restoration module 701 can operate to suppress a write operation and/or a read operation associated with a column with a defective cell or a portion of the column. Also, restoration module 701 accesses table 714 to determine a replacement memory address. Both of these events (e.g., access to primary memory array and secondary memory array) can occur in parallel (or substantially in parallel), or, in some cases, in series. In other examples, read voltage levels generated by column access voltage 706, as well as decoded address 702, are applied to table 714. Table 714 is then searched in parallel with primary memory'array access operations.

If restoration module 701 detects a defective cell address, then a corresponding replacement memory address for that defective cell address will be generated to divert access from the defective cell address in the primary memory array to the replacement memory address in secondary memory array 728. Defective cell detection circuit 712 transmits bits representing a replacement memory address 713 to decoder 722, which, in turn, uses the encoded replacement memory address 713 to activate a line for accessing a column of secondary memory array 728. For example, if the replacement memory address 713 can be represented by fours bits to cover addresses 0000 to 1111 (e.g., addresses 0 to 16), decoder 722 will output a signal on one of 16 lines (e.g., on 723). It is understood that different numbers of bits can be used across different memory designs and can be larger in quantity than in the previous example. In still other examples, error flag 724 can be inverted for external use using inverter 732.

If the access operation is a write operation, AND gate 730 provides write/read enable signal 720 (e.g., in an active state) to secondary memory array 728. Also, column access voltage 706b is applied to column access module 726 so that access voltage 706b can provide for writing of write data 734b into a replacement memory location, rather then the primary memory array. But if the access operation is a read operation, column access voltage 706b is applied at access voltage magnitudes that are sufficient to output data via MUX 738 as read data 736. In various examples, one or more of the following can constitute an access diverter: decoder 722; logic for diverting write operations and read operations, such as AND gate 730, with secondary memory array 728; column access module 726; and any other circuit that can facilitate diverting access from the primary memory array to secondary memory array 728.

Figure 8:
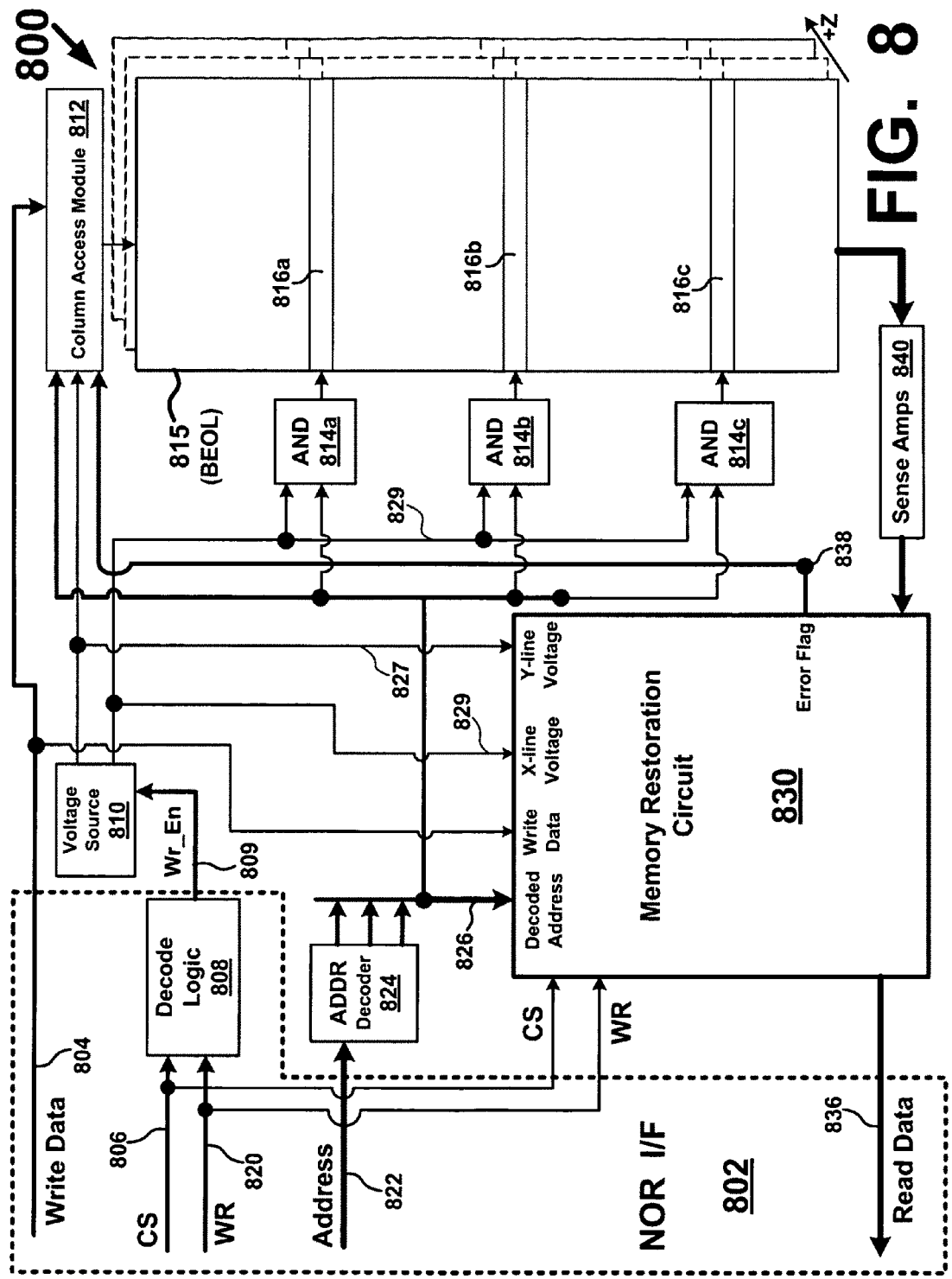
FIG. 8 depicts an exemplary memory restoration circuit implemented in a memory architecture that includes a NOR-type interface.

FIG. 8 depicts an exemplary memory restoration circuit implemented in a memory architecture that includes a NOR-type interface. As shown, memory architecture 800 includes NOR-type interface ("NOR I/F") 802, write data path ("Write Data") 804, chip select ("CS") path 806, decode logic 808, write enable path ("Wr_En") 809, voltage source 810, column access module 812, row access modules 814a-814c, a BEOL third dimensional memory array 815, rows 816a-816c, write/read enable path ("WR") 820, address path ("Address") 822, address decoder ("ADDR" Decoder) 824, decoded address path ("Decoded Address") 826, Y-line voltage path 827, X-line voltage path 829, memory restoration circuit 830, read data path ("Read Data") 836, error flag path ("Error Flag") 838, and sense amplifiers ("Sense Amps") 840. Memory restoration circuit 830, which operates in accordance to various examples as described herein, is configured to restore memory having defects in third dimensional memory array 815 that otherwise would be rendered unavailable. In some examples, the term "path" describes a conduit (or a terminal) over which (or through which) signals can be communicated.

Address ("ADDR") decoder 824 is configured to decode an address on address path 822 into a decoded address on decoded address path 826, which relates to one of the outputs of address decoder 824. Voltage source 810 is configured to generate read voltages and write voltages as row access voltages on X-line Voltage path 829 and column access voltages on Y-line Voltage path 827 that can respectively be applied to row access modules 814a-c and column access module 812. Column access module 812 can operate in an equivalent manner as similarly-named elements described in FIG. 5. Row access modules 814a, 814b, and 814c each operate to uniquely select a row, such as rows 816a, 816b, and 816c, respectively. In the example shown, memory restoration circuit 830 can be configured to transmit an error flag on Error Flag path 838 to a column driver (not shown) in column access module 812 that is associated with a defective column. In response, the column driver can disable a Y-line voltage that otherwise would be applied to a defective memory cell in a column of third dimensional memory array 815. In other examples, memory restoration circuit 830 can be configured to transmit an error flag on Error Flag path 838 to column access module 812 to disable writes and reads to third dimensional memory array 815, when an access relates to defective memory. For example, values associated with a decoded address from Decoded Address path 826, a column access voltage from Y-line Voltage path 827 and an error flag from Error Flag path 838 can be logically AND'ed together (not shown) in column access module 812 such that when Error Flag 838 is low (e.g., logic level "0"), access to one of the Y-lines or columns is disabled. Sense amplifiers ("Sense Amps") 840 can be configured to sense and generate read data for transmission as read data on Read Data path 836, when an access to third dimensional memory array 815 relates to non-defective memory.

NOR-type interface ("NOR I/F") 802 is configured to provide control signals, address signals and data signals for accessing third dimensional memory in either array 815 or replacement memory in memory restoration circuit 830, or both. As shown, NOR-type interface 802 is adapted to provide separate channels (or paths) for write data on Write Data path 804, address data on Address Data path 822, and read data on Read Data path 836. Further, NOR-type interface 802 provides channels (or paths) for chip select signals on CS path 806 and write enable signals on WR path 820. NOR-type interface 802 includes Decode Logic 808 for generating an internal write enable signal ("Wr_En") on write enable path 809 to cause voltage source 810 to transmit write and/or read access voltages. As different memory technologies can implement NOR-type interfaces 802, such as SRAM devices for example, memory architecture 800 can emulate SRAM memory technologies, as well as NOR FLASH memory technologies, and the like. As such, the replacement memory in memory restoration circuit 830 can be divided into individually-addressable bytes (e.g., 8 bits) as subsets of replacement memory. Note that NOR-type interface 802 can implement more or fewer signals, as necessary, to emulate different memory technologies. Note, too, that while FIG. 8 depicts array 815 as one memory plane (e.g., implement in one layer of multiple memory layers), other arrays associated with array 815 in the +Z dimension are shown in dashed lines. In other examples, memory architecture 800 and the above-described elements (e.g., elements shown and indicated by reference numerals above) can be implemented differently in design, operation, configuration, and materials, and are not limited to the descriptions provided herein.

Figure 9:
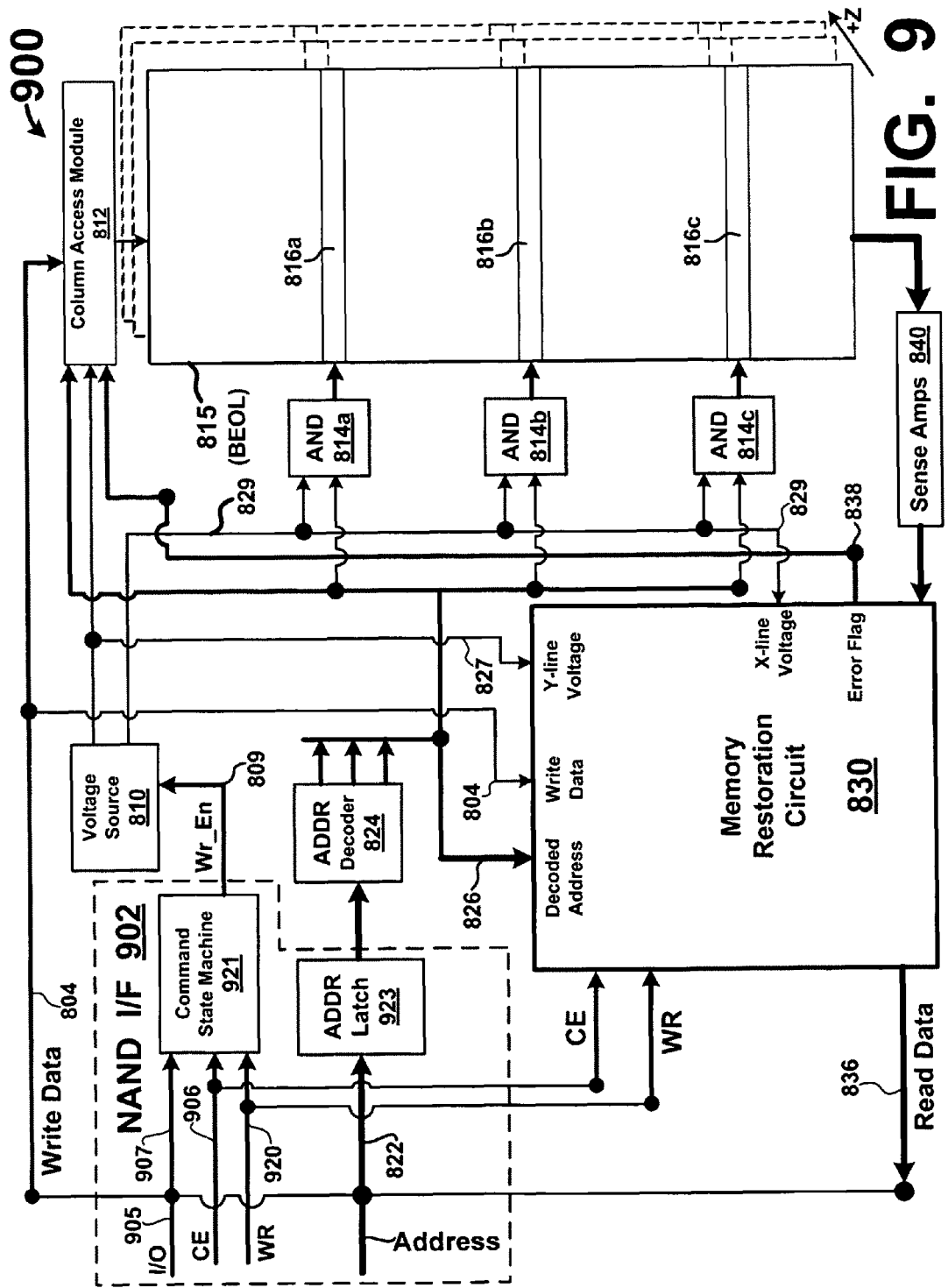
FIG. 9 depicts an exemplary memory restoration circuit implemented in a memory architecture that includes a NAND-type interface.

FIG. 9 depicts an exemplary memory restoration circuit implemented in a memory architecture that includes a NAND-type interface. As shown, memory architecture 900 includes NAND-type interface ("NAND I/F") 902, Input/Output ("I/O") bus 905, chip enable path ("CE") 906, command data path ("command data") 907, write/read enable path ("WR") 920, command state machine 921, address latch 923, write data path ("Write Data") 804, write enable path ("Wr_En") 809, voltage source 810, column access module 812, AND gates 814a-814c, a BEOL third dimensional memory array 815, rows 816a-816c, address path ("Address") 822, address ("ADDR") decoder 824, decoded address path ("Decoded Address") 826, Y-line voltage path ("Y-line Voltage") 827, X-line voltage path ("X-line Voltage") 829, memory restoration circuit 830, read data path ("Read Data") 836, error flag path ("Error Flag") 838, and sense amplifiers ("Sense Amps") 840. Note that elements in FIG. 9 that are also shown in FIG. 8 can have similar functions and/or structures.

NAND-type interface ("NAND I/F") 902 is configured to provide control signals, address signals and data signals for accessing third dimensional memory in either array 815 or replacement memory in memory restoration circuit 830, or both. As shown, NAND-type interface 902 is adapted to provide a shared bus for write data on write data path 804, address data on address data path 822, read data on read data path 836, and command data on command data path 907. The shared bus is shown as I/O bus 905. Further, NAND-type interface 902 provides channels (or paths) for chip enable on chip enable path ("CE") 906 and write enable on write enable path ("WR") 920 signals. NAND-type interface 902 includes command state machine 921 configured to implement commands for performing, for example, write and read operations. When writing, command state machine 921 can generate, for example, internal write enable signal ("Wr_En") on write enable path 809. Address latch ("ADDR latch") 923 is configured to receive address on address path 822 (e.g., over multiple bus cycles) and the address is latched until used. Note that NAND-type interface 902 can implement more or fewer signals, as necessary, to emulate different memory technologies. Examples of such signals include address latch enable and command enable signals.

As different memory technologies can implement NAND-type interfaces 902, such as DRAM devices, memory architecture 900 can emulate DRAM memory technologies, as well as NAND FLASH memory technologies and the like. Consider, for example, that memory architecture 900 is configured to emulate NAND FLASH memory. As such, array 815 can be partitioned into blocks with memory cell replacement being made at the column-level, in some examples. For example, memory cell replacement can be in groups of memory cells, such as a column (e.g., 64 word lines). Moreover, memory cell replacement can be individually replaced. In other examples, implementation of memory restoration circuit 830 becomes more cost-effective as the number of memory cells (e.g., bits) in each column increases. In particular, the ratio of error and substitute bits to primary memory array 302 (FIG. 3) gets smaller as the height of array 815 increases. Thus, increased efficiency can be realized in arrays having relatively long bit lines (e.g., increasing number of word lines). Note that this is typically the case in relation to NAND FLASH memory designs for which memory architecture 900 emulates. In one instance, row 816a can include 64 word lines or more. As such, the replacement memory in memory restoration circuit 830 can be divided into individually-addressable columns, of 64 word lines as subsets of replacement memory. Note, too, that while FIG. 9 depicts array 815 as one memory plane (e.g., implement in one layer of multiple memory layers), other arrays associated with array 815 in the +Z dimension are shown in dashed lines. In other examples, memory architecture 900 and the above-described elements (e.g., elements shown and indicated by reference numerals above) can be implemented differently in design, operation, configuration, and materials, and are not limited to the descriptions provided herein.

Figure 10:
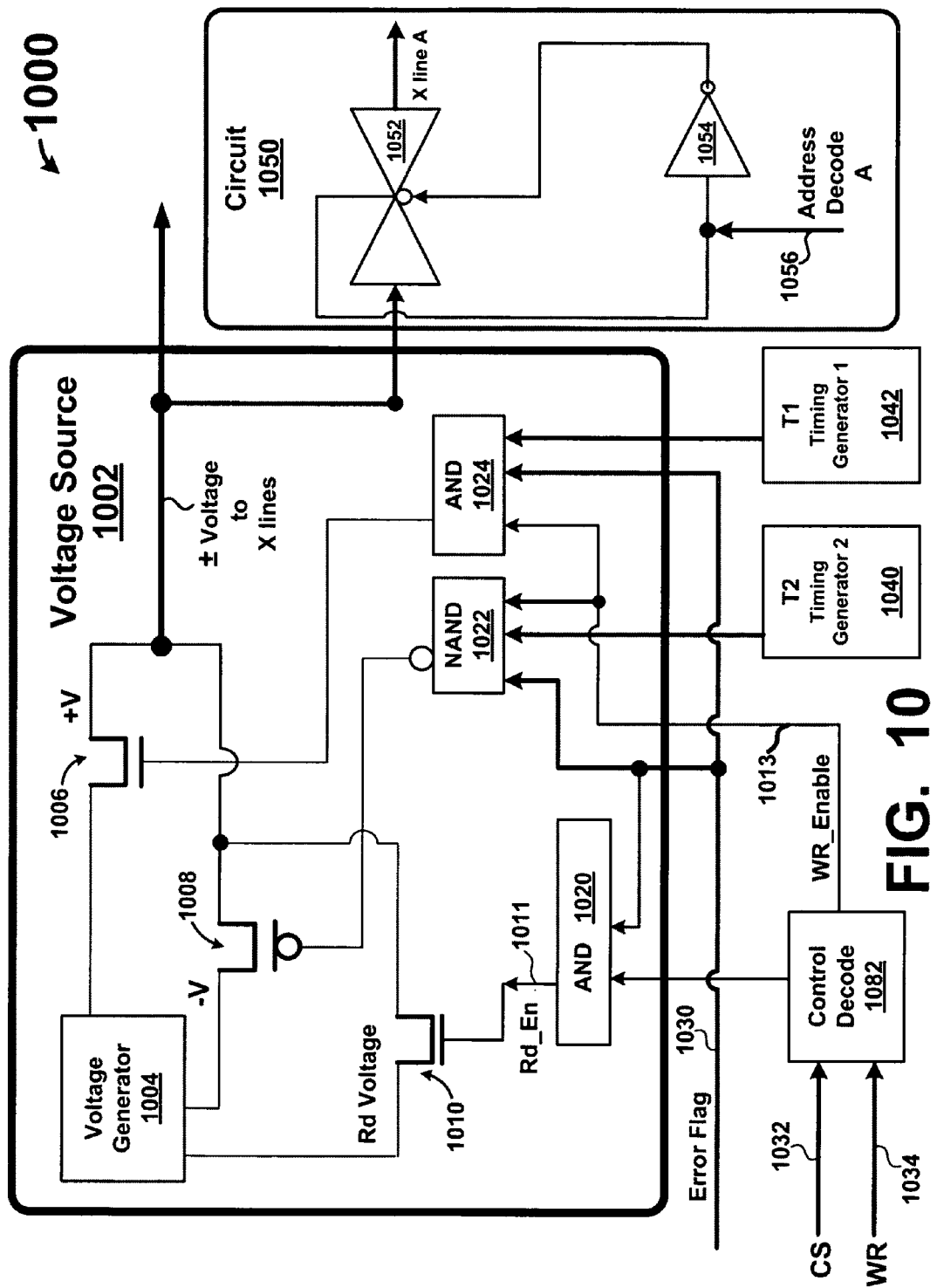
FIG. 10 is a diagram depicting an example of a voltage source for use with a memory restoration circuit.

FIG. 10 is a diagram depicting an example of a voltage source for use with a memory restoration circuit. In the example depicted, a voltage source 1000 can be configured as an interruptible voltage source. As such, interruptible voltage source 1002, which typically provides access voltages to a primary memory array, can be interrupted so as to suppress the transmission of the access voltages in response to an address error signal 1030 at address error port 1080. In this example, address error signal 1030 need not be routed to row access units and column access units as described in other examples herein.

Voltage source 1000 includes a voltage generator 1004 configured to generate read voltages and write voltages as access voltages. It also includes transistors 1010, 1008, and 1006 for disabling transmission of access voltages to, for example, a column having a defect. Logic gates 1020, 1022, and 1024 are configured to respectively control operation of transistors 1010, 1008, and 1006 in response to error flag on Error Flag path 1030 that, when low, disables reads and writes to a particular column. Control decode 1082 generates read enable signals ("RD_En") 1011 when, for example, chip select ("CS") signal on chip select path 1032 is active, but write enable ("WR") on write enable path 1034 is inactive. But when write enable on write enable path 1034 is active, an internal WR_Enable signal 1013 enables writes to the primary memory array. Timing generator 1 ("T1") 1042 and timing generator 2 ("T2") 1040 cooperate, when error flag on Error Flag path 1030 is high (e.g., inactive), to generate timing signals to control the alternate application of negative write voltages ("−V") to write zeroes and positive write voltages ("+V") to write ones. Writing in this manner, at least for some third dimensional memory cells, is a two-cycle operation with a positive voltage applied at T1 and a negative voltage applied at T2, both producing the positive and negative voltages driven down the column line selected by address decode signal ("A") 1056, which implements circuit 1050 to send an access voltage down the column for reading. Circuit 1050 is an example of a gating circuit that includes inverter 1054 and transmission gate 1052, which enables transmission of a column access voltage to a single column as determined by address decode signal ("A") 1056. In other examples, voltage source 1000 and the above-described elements (e.g., elements shown and indicated by reference numerals above) can be implemented differently in design, operation, and configuration, and are not limited to the descriptions provided herein.

Figure 11A:
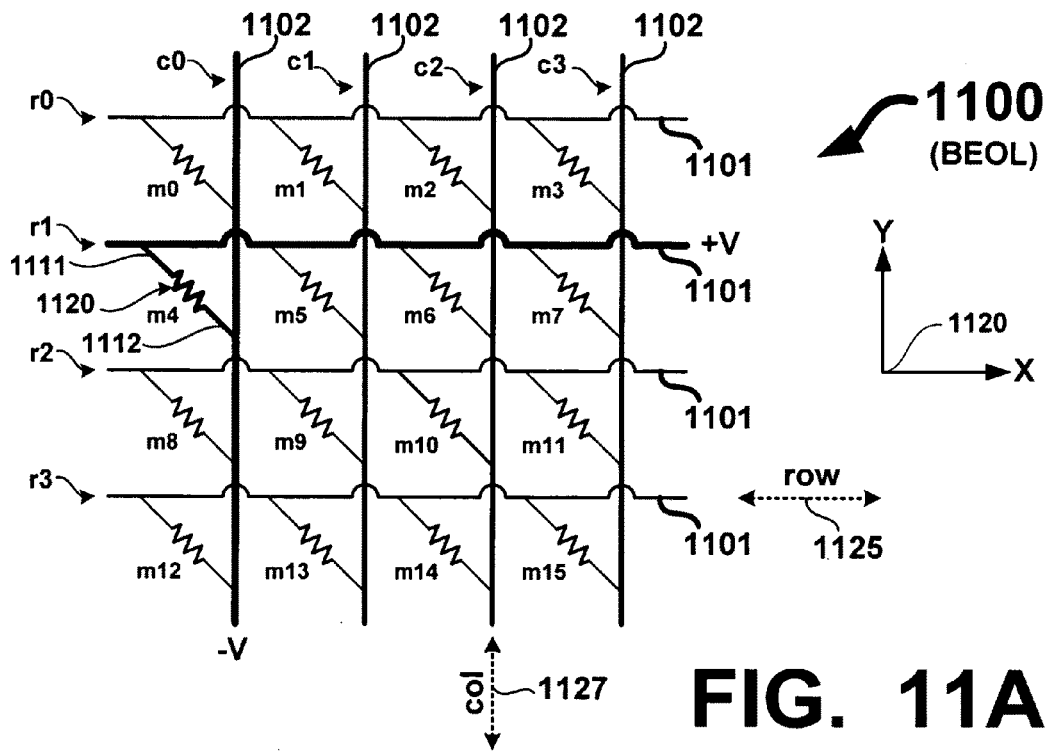
FIG. 11A depicts a schematic representation of a two-terminal cross-point memory array.

Reference is now made to FIG. 11A where a schematic of a two-terminal cross-point memory array 1100 includes a plurality of X-direction conductive array lines 1101 denoted as rows r0-r3, a plurality of Y-direction conductive array lines 1102 denoted as columns c0-c3, and a plurality of two-terminal memory cells denoted as cells m0-m15. The X-direction and Y-direction array lines are oriented substantially orthogonal to one another as denoted by axes 1020 such that the X-direction array lines 1101 are substantially parallel with one another and are aligned with the X-axis X and the Y-direction array lines 1102 are substantially parallel with one another and are aligned with the Y-axis Y. The X-direction array lines 1101 do not come into contact with one another and do not come into contact with the Y-direction array lines 1102. Similarly, the Y-direction array lines 1102 do not come into contact with one another and do not come into contact with the X-direction array lines 1101.

Each memory cell includes a first terminal 1111 electrically coupled with only one of the X-direction array lines 1101 and a second terminal 1112 electrically coupled with only one of the Y-direction array lines 1102 and is positioned at an intersection of its respective array lines (1101, 1102) such that each memory cell is positioned at a cross-point of the array lines (1101, 1102) it is electrically coupled with. Here memory cell m4 (denoted in heavy line) is selected for access 1120 by applying an access voltage +V on row conductive array line r1 and applying an access voltage −V on column conductive array line c0 such that a potential difference is applied across the terminals (1111, 1112) of memory cell m4.

Figure 11B:
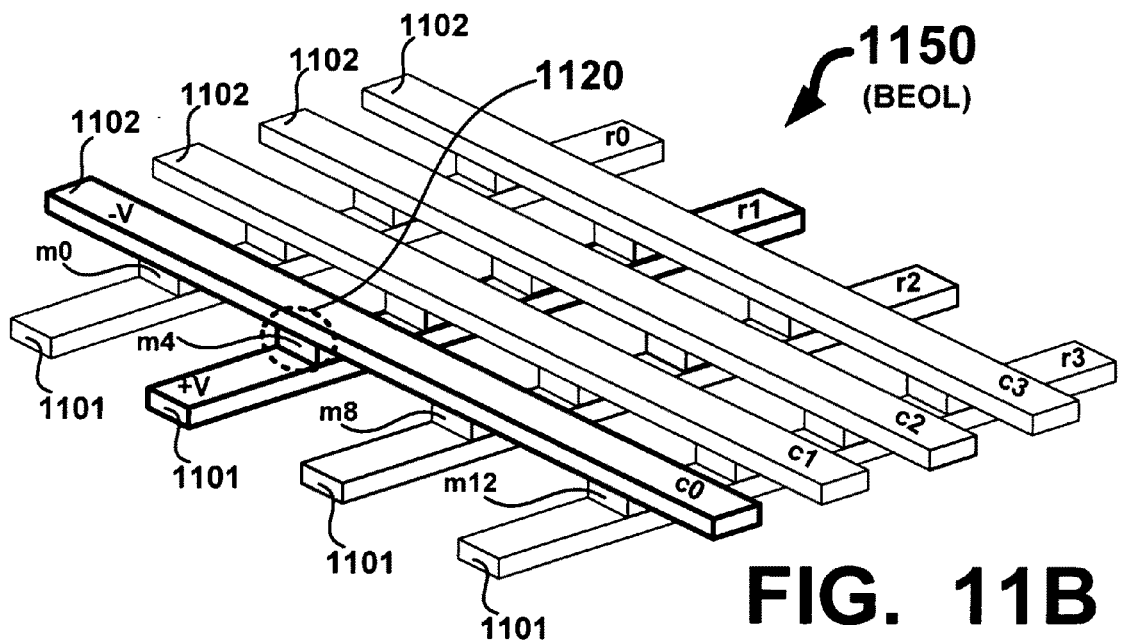
FIG. 11B depicts a profile view of a two-terminal cross-point memory array.
Figure 11C:
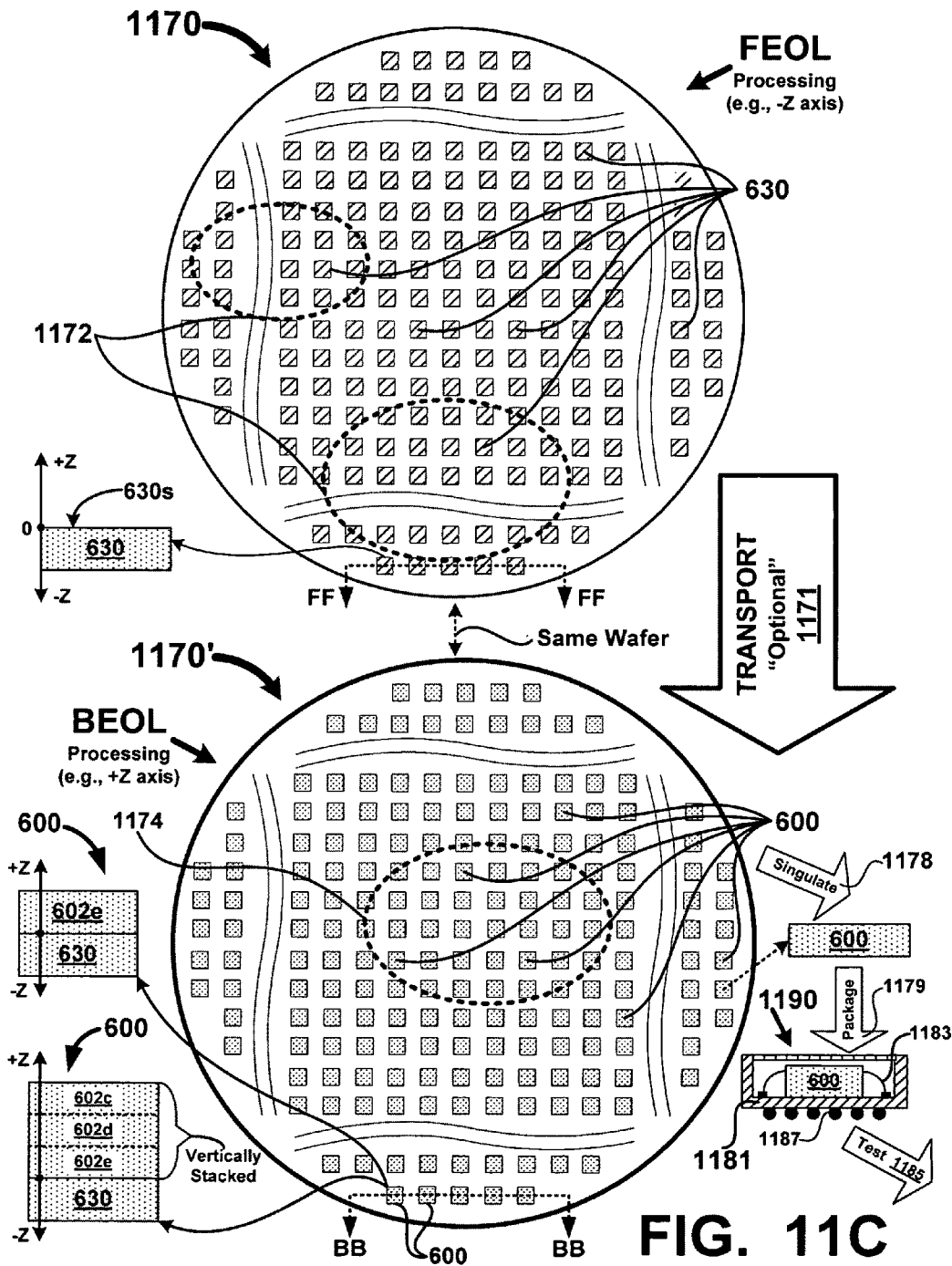
FIG. 11C depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

Moving on to FIG. 11B, a profile view of a two-terminal cross-point memory array 1150 includes the two-terminal memory cells m0-m15 and the array lines (1101, 1102) described above in reference to FIG. 11A. Here, memory cell m4 is selected for access 1120 (e.g., a read or write operation) by applying the voltages +V and −V to row conductive array line r1 and column conductive array line c0 respectively, as depicted in heavy line. The arrays (1100, 1150) depicted in FIGS. 11A and 11B are BEOL structures that are fabricated on top of and in contact with the FEOL portion (not shown) that includes the circuitry configured for performing data operations on the arrays. Although a single layer or plane is depicted in FIGS. 11A and 11B, there can be multiple layers or planes of vertically stacked two-terminal cross-point memory arrays with each array including a plurality of the above described two-terminal memory cells. In some applications, conductive array lines can be shared (e.g., are electrically coupled with) by memory cells positioned in adjacent memory layers or planes. In other applications, the conductive array lines in each memory layer or plane are electrically isolated from the conductive array lines in adjacent memory layers or planes.

A "memory layer," or "memory plane" as the term is used herein, is not necessarily a homogenous layer of material, but a layer of memory cells, such as two-terminal memory cells, for example. Each memory cell can include a two-terminal memory element that can be made up of several different layers of thin film materials. The term "element" is meant to be generally applicable to any stack or formation between complementary conductive array lines, and not intended to be limited to any manufacturing process. Memory elements and memory cells are described in greater detail below in reference to FIGS. 12-12C.

Reference is now made to FIG. 11, where a top plan view depicts a single wafer (denoted as 1170 and 1170') at two different stages of fabrication: FEOL processing on the wafer denoted as 1170 during the FEOL stage of processing where the above mentioned active circuitry in logic plane 630 (see FIG. 6) is formed; followed by BEOL processing on the same wafer denoted as 1170' during the BEOL stage of processing where one or more layers of non-volatile memory are formed (e.g., layer(s) 602e, 602d, 602c, 602b, . . . 602a). Wafer 1170 includes a plurality of the base layer die 630 (see 630 in FIG. 6) formed individually on wafer 1170 as part of the FEOL process. As part of the FEOL processing, the base layer die 630 may be tested 1172 to determine their electrical characteristics, functionality, performance grading, etc. After all FEOL processes have been completed, the wafer 1170 is optionally transported 1171 for subsequent BEOL processing (e.g., adding one or more layers of memory such as single layer 602e or multiple layers 602e, 602d, 602c, 602b, . . . 602a) directly on top of each base layer die 630. A base layer die 630 is depicted in cross-sectional view along a dashed line FF-FF where the substrate the die 630 is fabricated on (e.g., a silicon Si wafer) and its associated active circuitry are positioned along the −Z axis. For example, the one or more layers of memory are grown directly on top of an upper surface 630s of each base layer die 630 as part of the subsequent BEOL processing.

During BEOL processing the wafer 1170 is denoted as wafer 1170', which is the same wafer subjected to additional processing to fabricate the memory layer(s) directly on top of the base layer die 630. Base layer die 630 that failed testing may be identified either visually (e.g., by marking) or electronically (e.g., in a file, database, email, etc.) and communicated to the BEOL fabricator and/or fabrication facility. Similarly, performance graded base layer die 630 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1171 may not be necessary and the wafer 1170 can continue to be processed as the wafer 1170'. The BEOL process forms the aforementioned memory layer(s) directly on top of the base layer die 630 to form a finished die 600 (see 800 in FIG. 6) that includes the FEOL circuitry portion 630 along the −Z axis and the BEOL memory portion along the +Z axis. A cross-sectional view along a dashed line BB-BB depicts a memory device die 600 with a single layer of memory 602e grown (e.g., fabricated) directly on top of base die 630 along the +Z axis, and alternatively, another memory device die 600 with three vertically stacked layers of memory 602e, 602d, and 602c grown (e.g., fabricated) directly on top of base die 630 along the +Z. Finished die 600 on wafer 1170' may be tested 1174 and good and/or bad die identified. Subsequently, the wafer 1170' can be singulated 1178 to remove die 600 (e.g., die 600 are precision cut or sawed from wafer 1170') to form individual memory device die 600. The singulated die 600 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 600 can be mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield. One or more of the IC's 1190 can be used in a data storage system where it is advantageous to replace defective memory cells to ensure data integrity and/or allow continued system operation when the memory contains defective memory cells. The data storage system includes but is not limited to embedded memory systems (e.g., portable PC's, cell phones, PDA's, image capture devices, portable game players, MP3 players, video players, etc.), RAID storage systems in which the non-volatile memory in the one or more layers of memory in each IC 1190 is used to replace or supplant hard disc drives (HDD's) in the RAID a system, and systems using solid state drives (SSD's). Unlike conventional FLASH non-volatile memory, the IC's 1190 do not require an erase operation prior to a write operation so the latency associated with the erase operation is eliminated and the latency associated with FLASH OS and/or FLASH file system required for managing the erase operation is eliminated. Another application for the IC's 1190 is as a replacement for conventional FLASH-based non-volatile memory in solid state drives (SSD's). Here, one or more of the IC's 1190 can be mounted to a PC board along with other circuitry and placed in an appropriate enclosure to implement a SSD that can be used to replace a HDD. As mentioned above, the IC's 1190 do not require an erase before write operation and its associated latency and overhead. For both RAID and SSD applications, the vertically stacked memory arrays allow for increases in storage density without increasing die size because the memory arrays are fabricated above their associated active circuitry so extra memory capacity can be achieved by adding additional layers of memory above the FEOL base layer die 630.

Figure 12:
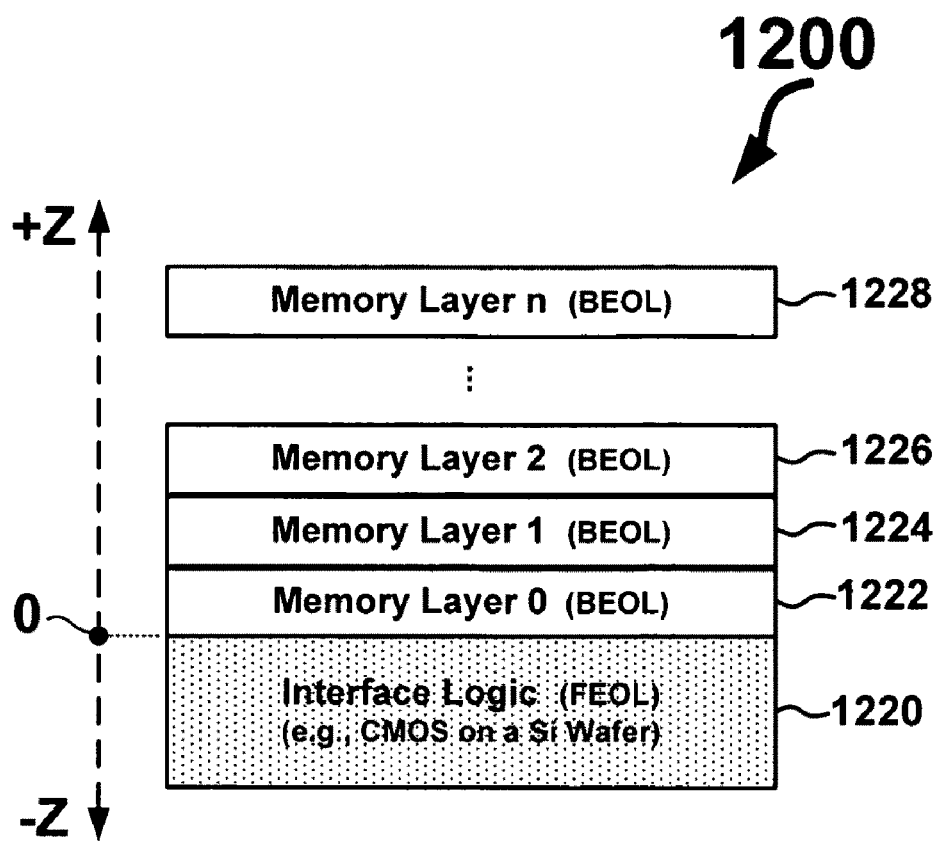
FIG. 12 depicts an exemplary cross-sectional view of a vertically configured non-volatile, third dimensional memory array.

FIG. 12 depicts an exemplary cross-sectional view of a vertically configured non-volatile third dimensional memory array. Here, a memory array 1200 includes FEOL interface logic 1220 and BEOL memory layers "0" through "n" 1222-1228. BEOL memory layer 0 1222 is in contact with the FEOL portion 1220 (−Z) and is fabricated above (+Z) the substrate the FEOL portion 1220 is fabricated on and the memory layers 1-n (1224-1228) are fabricated above the memory layer 0 1222 along the +Z axis such that those layers are vertically stacked above one another. The memory array 1200 can be implemented as an integrated circuit (IC). In some examples, memory array 1200 includes interface logic 1220 (e.g., the FEOL portions depicted in FIGS. 1-10), which can be vertically configured with one, two, three, or multiple (i.e., "n") BEOL memory array layers 1222-1228. Each of memory array layers 1222-1228 can be used for implementing different aspects of an apparatus (e.g., apparatus 100 (FIG. 1), and others). For example, a FEOL base layer of memory array 1200 (e.g., layer 1220) may be used to implement control logic or an interface between BEOL memory cell in a memory system configured for replacement of defective memory cells, while memory array layers 1222-1228 may be used to implement memory for data storage and for replacement memory. Further, memory array layers 1222-1228 may be used to implement "N" number of memory types, where each of memory array layers 1222-1228 are configured to emulate a different type of memory (e.g., SRAM, DRAM, NOR, NAND, FLASH, and others). Still further, each of memory array layers 1222-1228 may be configured, formed, fabricated, or otherwise implemented entirely or partially to emulate a memory type. In other examples, memory array layers 1222-1228 may be implemented as the same memory type. In still other examples, the number of memory array layers 1222-1228 may be varied to include more, fewer, or different layers than those shown and described.

As an example, logic may be formed FEOL in layer 1220 below the origin 0 along the −Z axis and the one or more layers of memory 1222-1228 can be fabricated BEOL above the FEOL base layer 1220 along the +Z axis (e.g., fabricated BEOL directly on top of surface 1220s of FEOL base layer 1220). Further, memory elements such as those described above may be formed BEOL in memory array layer 1222 and layer 1224. In still other examples, more, fewer, or different layers than those shown may be used. In other examples, memory array 1200 and the above-described elements may be varied and are not limited to the functions, structures, configurations, or implementations provided.

Figure 12A:
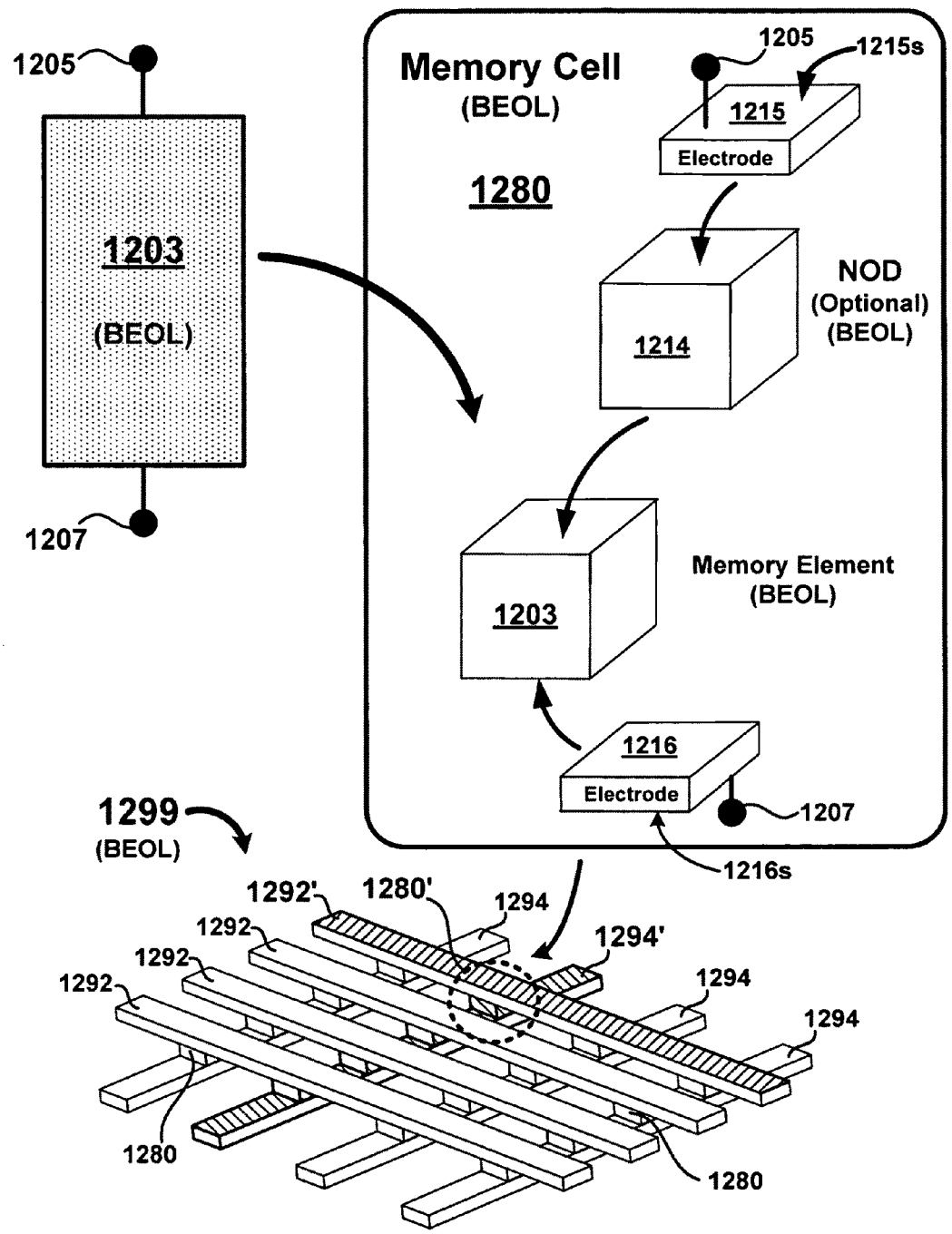
FIG. 12A depicts an example of memory cells positioned in a two-terminal cross-point array.

FIG. 12A depicts an example of arrayed memory cells. In this example, a non-volatile re-writable memory cell 1280 can be used to implement the aforementioned non-volatile memory cells. The memory cell 1280 includes a memory element 1203 and terminals 1205 and 1207 with the memory element 1203 electrically in series with the terminals 1205 and 1207. In that the memory element 1203 is electrically in series with the memory cell 1280 and is included in the memory cell 1280, the terminology memory cell or memory element may be used interchangeably herein to describe the structure in which non-volatile data is stored. Terminals 1205 and 1207 can be electrically coupled with or can be formed as electrodes 1212 and 1216. The electrodes (1212, 1216) can be made from an electrically conductive material including but not limited to, platinum (Pt), gold (Au), silver (Ag), iridium (Ir), iridium oxide ($IrO_x$), ruthenium (Ru), palladium (Pd), aluminum (Al), and the like.

In at least some implementations, memory cell 1280 can include an optional non-ohmic device (NOD) 1214, which, in turn, can be formed on the memory element 1203 (e.g., either above or below memory element 1203). NOD 1214 can be a "metal-insulator-metal" (MIM) structure that includes one or more layers of electronically insulating material that are in contact with one another and sandwiched between metal layers (e.g., electrodes), or NOD 1214 can be a pair of diodes connected in a back-to-back configuration. U.S. patent application Ser. No. 11/881,473, filed Jul. 26, 2007, now U.S. Published Application No. 2009-0027976 A1, and entitled "Threshold Device For A Memory Array" and U.S. patent application Ser. No. 12/283,339, filed Sep. 11, 2008, now U.S. Published Application No. 2009-0016094 A1, and entitled "Selection Device for Re-Writable Memory" are both hereby incorporated by reference in their entirety and for all purposes and describe metal-insulator-metal and diode based non-ohmic devices. NOD 1214 can be another type of selection device and the present invention is not limited to the examples disclosed herein. The NOD 1214 and the memory element 1203 are electrically in series with each other and with the terminals 1205 and 1207. Memory cell 1280 can be formed between conductive array lines, such as array lines 1292 and 1294. Thus, memory cell 1280 can be formed in an array of other memory cells. The array can be a cross-point array 1299 including a plurality of the conductive array lines 1292 and 1294, and a plurality of the memory cells 1280. For example, array lines 1292 can be electrically coupled with the electrodes 1212 of the memory cells 1280 and/or may be in contact with a surface 1212s of the electrodes 1212 and array lines 1294 can be electrically coupled with the electrodes 1216 of the memory cells 1280 and/or may be in contact with a surface 1216s of the electrodes 1216. A memory cell 1280' is selected for a data operation (e.g., read or write operation) by applying select voltages (e.g., read voltages, write voltages, program voltages, or erase voltages) to its respective conductive array lines 1292' and 1294'.

Figure 12B:
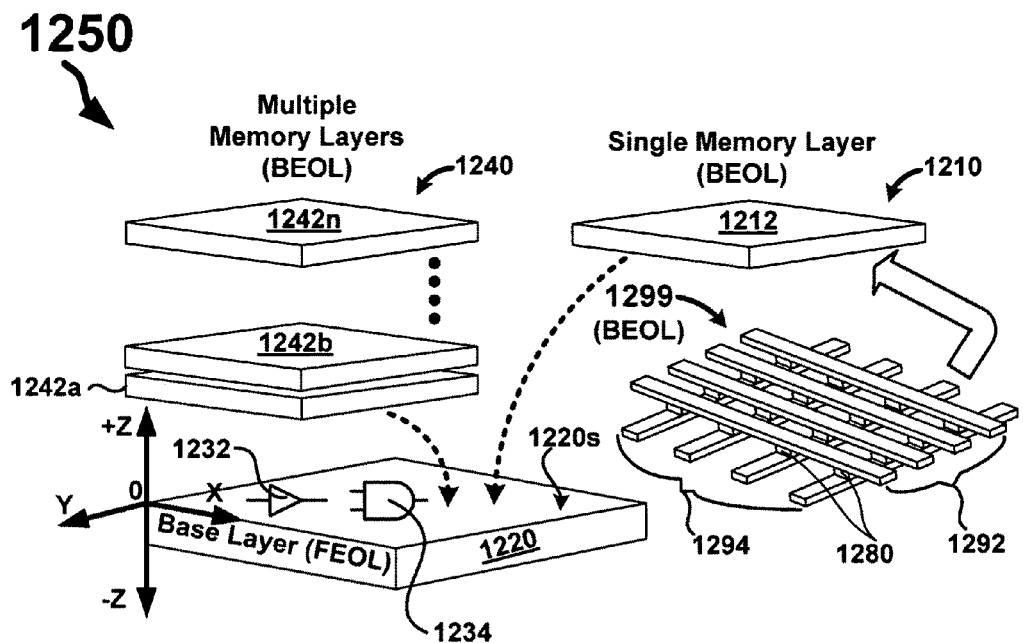
FIG. 12B depicts an integrated circuit including memory cells disposed in a single memory array layer or in multiple memory array layers and fabricated over a substrate that includes active circuitry fabricated in a logic layer.

Turning now to FIG. 12B, an integrated circuit 1250 can include non-volatile and re-writable memory cells 1280 disposed in a single layer 1210 or in multiple layers 1240 of memory. The single 1210 or multiple 1240 layers of memory can be fabricated BEOL as described above. In this example, integrated circuit 1250 is shown to include either multiple layers 1240 of memory (e.g., layers 1242a, 1242b, ... 1242n) or a single layer 1210 of memory 1212 formed on (e.g., fabricated above) a base layer 1220 (e.g., a silicon wafer) that can be used to implement the FEOL circuitry portions described above. The single layer 1210 or multiple layers 1242a, 1242b, ... 1242n of memory can be used to implement the layers of memory 1222-1228 depicted in FIG. 12. The base layer 1220 can be fabricated FEOL with the single or multiple layers of memory 1210 and/or 1240 fabricate BEOL on top of the base layer 1220 (e.g., directly on top of an upper surface 1220s of FEOL layer base layer 1220).

In at least some implementations, each layer of memory (1212, or 1242a, 1242b, ... 1242n) can include the cross point array 1299 fabricated (e.g., BEOL) and having conductive array lines (1292, 1294) arranged in different directions (e.g., substantially orthogonal to one another) to access memory cells 1280 (e.g., two-terminal memory cells). For example, conductors 1292 can be X-direction array lines (e.g., row conductors) and conductors 1294 can be Y-direction array lines (e.g., column conductors). Base layer 1220 (e.g., substrate 1220 in FIG. 12) can include a bulk semiconductor substrate upon which circuitry, such as memory access circuits (e.g., restoration module, voltage generators, defective cell detection circuitry, address decoders, drivers, sense amps, etc.) can be formed. For example, base layer 1220 may be a silicon (Si) substrate upon which the active circuitry 1232 and 1234 are fabricated. The active circuitry 1232 and 1234 can include analog and digital circuits configured to perform data operations on the memory layer(s) that are fabricated above the base layer 1220. An interconnect structure (not shown) including vias, plugs, thrus, and the like, may be used to electrically communicate signals from the active circuitry 1230 to the conductive array lines (1292, 1294).

Figure 12C:
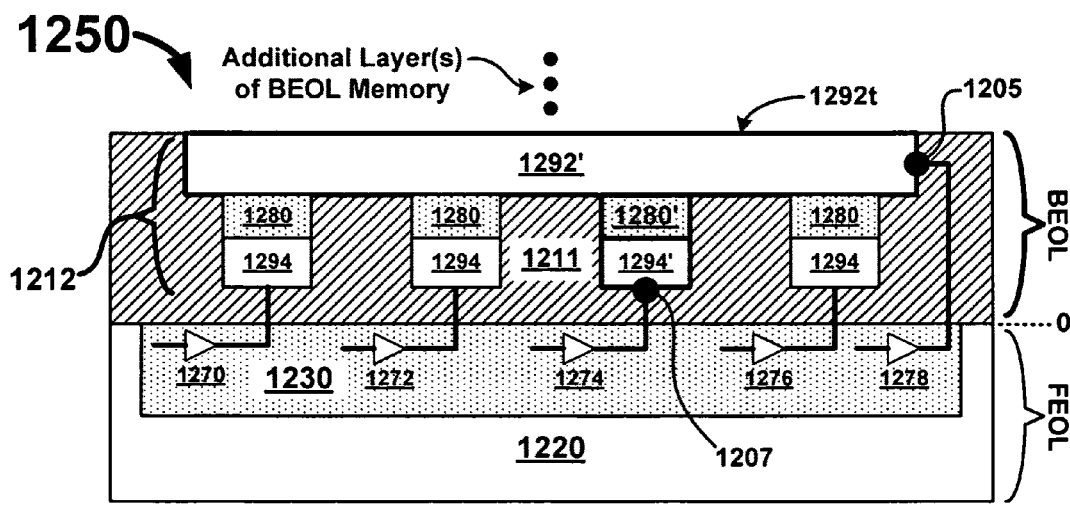
FIG. 12C depicts a cross-sectional view of an integrated circuit including a single layer of memory fabricated over a substrate including active circuitry fabricated in a logic layer.

Reference is now made to FIG. 12C, where integrated circuit 1250 includes the base layer 1220 and active circuitry 1232 and 1234 (denoted as 1230) fabricated on the base layer 1220. As one example, the base layer 1220 can be a silicon (Si) wafer and the active circuitry 1230 can be microelectronic devices formed on the base layer 1220 using a CMOS fabrication process. The active circuitry 1230 in base layer 1220 can be used to implement the non-memory portions of the circuitry depicted in FIGS. 1-10, such as the restoration module, for example. The memory cells 1280 and their respective conductive array lines (1292, 1294) can be fabricated on top of the active circuitry 1230 in the base layer 1220 and the memory cells 1280 can be used to implement the memory cells depicted in FIGS. 1 and 2.

Those skilled in the art will appreciate that an inter-level interconnect structure (not shown) can electrically couple the conductive array lines (1292, 1294) with the active circuitry 1230 which may include several metal layers. For example, vias can be used to electrically couple the conductive array lines (1292, 1294) with the active circuitry 1230. The active circuitry 1230 may include but is not limited to the circuitry portions depicted in FIGS. 1-10, restoration circuitry, address decoders, sense amps, memory controllers, logic gates, analog circuitry, data buffers, direct memory access (DMA) circuits, voltage sources for generating the read and write voltages, just to name a few. For example, active circuits 1271-1278 can be configured to apply the select voltage potentials (e.g., read and write voltage potentials) to selected conductive array lines (1292', 1294') for selected memory cell 1280' via terminals 1205 and 1207 that are electrically coupled with outputs of active circuits 1274 and 1278 respectively.

Moreover, active circuits 1271-1278 can be electrically coupled with the conductive array lines (1292', 1294') to sense the read current $I_R$ from selected memory cells 1280' during a read operation and the sensed current can be processed by active circuits 1271-1278 to determine the conductivity profiles (e.g., the resistive state) of the selected memory cells 1280'. In some applications, it may be desirable to prevent un-selected array lines (1292, 1294) from floating. The active circuits 1271-1278 can be configured to apply an unselect voltage potential (e.g., approximately a ground potential) to the un-selected array lines (1292, 1294). A dielectric material 1211 (e.g., $SiO_2$) may be used where necessary to provide electrical insulation between elements of the integrated circuit 1250.

Although only a single layer of memory 1212 is depicted in FIG. 12C, additional layers of memory (e.g., 1242a-1242n) can be vertically fabricated BEOL above an upper surface 1292t of conductive array line 1292 to form a multi-layer cross-point memory array. The vertically stacked layers of memory can have electrically isolated conductive array lines as depicted in FIGS. 12-12C or can have shared conductive array lines (not shown).

The invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any example; rather features and aspects of one example can readily be interchanged with other examples. Notably, not every benefit described herein need be realized by each example; rather any specific example can provide one or more of the advantages discussed above. In the claims, elements and/or operations do not imply any particular order of operation, unless explicitly stated in the claims. It is intended that the following claims and their equivalents define the scope of the invention.

What is claimed is:

1. An apparatus, comprising:
a back-end-of-the-line (BEOL) primary memory array including a plurality of BEOL memory cells configured to change resistivity;
a BEOL secondary memory array including another plurality of BEOL memory cells configured to change resistivity; and
a front-end-of-the-line (FEOL) restoration module electrically coupled with the primary memory array and the secondary memory array, the restoration module being configured to replace a defective BEOL memory cell positioned in the primary memory array with a BEOL memory cell positioned in the secondary memory array,
wherein the restoration module is configured to
identify a defective BEOL column that is associated with the defective BEOL memory cell, and
use another BEOL column that is associated with the BEOL memory cell, wherein the defective BEOL column and the another BEOL column reside on different memory planes.

2. An apparatus, comprising:
a back-end-of-the-line (BEOL) primary memory array including a plurality of BEOL memory cells configured to change resistivity;
a BEOL secondary memory array including another plurality of BEOL memory cells configured to change resistivity; and
a front-end-of-the-line (FEOL) restoration module electrically coupled with the primary memory array and the secondary memory array, the restoration module being configured to replace a defective BEOL memory cell positioned in the primary memory array with a BEOL memory cell positioned in the secondary memory array,
wherein the restoration module is configured to
identify a defective BEOL column that is associated with the defective BEOL memory cell, and
use another BEOL column that is associated with the BEOL memory cell, wherein the defective BEOL column and the another BEOL column reside on a common memory plane.

3. An apparatus, comprising:
a back-end-of-the-line (BEOL) primary memory array including a plurality of BEOL memory cells configured to change resistivity;
a BEOL secondary memory array including another plurality of BEOL memory cells configured to change resistivity; and
a front-end-of-the-line (FEOL) restoration module electrically coupled with the primary memory array and the secondary memory array, the restoration module being configured to replace a defective BEOL memory cell positioned in the primary memory array with a BEOL memory cell positioned in the secondary memory array,
wherein the restoration module further comprises a plurality of resistive BEOL memory cells configured to store data for modifying the data path change from a resistive state to another resistive state.

4. An apparatus, comprising:
a back-end-of-the-line (BEOL) primary memory array including a plurality of BEOL memory cells configured to change resistivity;
a BEOL secondary memory array including another plurality of BEOL memory cells configured to change resistivity;
a plurality of stacked BEOL memory planes; and
a front-end-of-the-line (FEOL) restoration module electrically coupled with the primary memory array and the secondary memory array, the restoration module being configured to replace a defective BEOL memory cell positioned in the primary memory array with a BEOL memory cell positioned in the secondary memory array,
wherein at least one of the plurality of stacked BEOL memory planes includes one or more of the primary memory array, the secondary memory array, and at least a portion of the restoration module.

5. An apparatus, comprising:
a back-end-of-the-line (BEOL) primary memory array including a plurality of BEOL memory cells configured to change resistivity;
a BEOL secondary memory array including another plurality of BEOL memory cells configured to change resistivity;
a front-end-of-the-line (FEOL) restoration module electrically coupled with the primary memory array and the secondary memory array, the restoration module being configured to replace a defective BEOL memory cell positioned in the primary memory array with a BEOL memory cell positioned in the secondary memory array; and
a FEOL voltage source configured to suspend application of voltage to at least a portion of the primary memory array containing the defective BEOL memory cell after detecting access to the defective BEOL memory cell.

6. An apparatus, comprising:
a back-end-of-the-line (BEOL) primary memory array including a plurality of BEOL memory cells configured to change resistivity;
a BEOL secondary memory array including another plurality of BEOL memory cells configured to change resistivity; and
a front-end-of-the-line (FEOL) restoration module electrically coupled with the primary memory array and the secondary memory array, the restoration module being configured to replace a defective BEOL memory cell positioned in the primary memory array with a BEOL memory cell positioned in the secondary memory array,
wherein access to the secondary memory array and access to the primary memory array occur substantially in parallel to each other.

7. An apparatus, comprising:
a back-end-of-the-line (BEOL) primary memory array including a plurality of BEOL memory cells configured to change resistivity;
a BEOL secondary memory array including another plurality of BEOL memory cells configured to change resistivity;
a front-end-of-the-line (FEOL) restoration module electrically coupled with the primary memory array and the secondary memory array, the restoration module being configured to replace a defective BEOL memory cell positioned in the primary memory array with a BEOL memory cell positioned in the secondary memory array; and
a voltage source configured to suspend voltage to at least a portion of the secondary memory array after detecting an access to another memory cell in the primary memory array.

* * * * *